US010235930B2

(12) United States Patent
Saotome et al.

(10) Patent No.: US 10,235,930 B2
(45) Date of Patent: Mar. 19, 2019

(54) FIELD-EFFECT TRANSISTOR INCLUDING FIRST AND SECOND GATE INSULATING LAYERS, DISPLAY ELEMENT, IMAGE DISPLAY DEVICE AND SYSTEM INCLUDING FIELD-EFFECT TRANSISTOR

(71) Applicants: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(72) Inventors: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 50 days.

(21) Appl. No.: 15/371,500

(22) Filed: Dec. 7, 2016

(65) Prior Publication Data
US 2017/0162172 A1 Jun. 8, 2017

(30) Foreign Application Priority Data
Dec. 8, 2015 (JP) .................................. 2015-239662

(51) Int. Cl.
*G09G 3/3225* (2016.01)
*G09G 5/10* (2006.01)
(Continued)

(52) U.S. Cl.
CPC ........... *G09G 3/3225* (2013.01); *G09G 5/003* (2013.01); *G09G 5/10* (2013.01); *H01L 27/124* (2013.01);
(Continued)

(58) Field of Classification Search
CPC ............... H01L 27/1225; H01L 27/124; H01L 27/3225; H01L 27/3241; H01L 27/283;
(Continued)

(56) References Cited

U.S. PATENT DOCUMENTS 9,112,039 B2   8/2015  Ueda et al.
9,418,842 B2   8/2016  Nakamura et al.
(Continued)

FOREIGN PATENT DOCUMENTS

JP   2011-151370   8/2011
JP   2011-216694   10/2011
(Continued)

OTHER PUBLICATIONS

K. Nomura, and 5 others "Room-temperature fabrication of transparent flexible thin film transistors using amorphous oxide semiconductors", Nature, vol. 432, Nov. 25, 2004, pp. 488 to 492.

*Primary Examiner* — Darlene M Ritchie
(74) *Attorney, Agent, or Firm* — Cooper & Dunham LLP

(57) ABSTRACT

A field-effect transistor including: a gate electrode, which is configured to apply gate voltage; a source electrode and a drain electrode, which are configured to take electric current out; a semiconductor layer, which is disposed to be adjacent to the source electrode and the drain electrode; and a gate insulating layer, which is disposed between the gate electrode and the semiconductor layer, wherein the gate insulating layer includes a first gate insulating layer containing a first oxide containing Si and an alkaline earth metal and a second gate insulating layer disposed to be in contact with
(Continued)

the first gate insulating layer and containing a paraelectric amorphous oxide containing a Group A element which is an alkaline earth metal and a Group B element which is at least one selected from the group consisting of Ga, Sc, Y, and lanthanoid.

18 Claims, 18 Drawing Sheets

(51) Int. Cl.
*G09G 5/00* (2006.01)
*H01L 27/12* (2006.01)
*H01L 27/32* (2006.01)
*H01L 29/49* (2006.01)
*H01L 29/786* (2006.01)

(52) U.S. Cl.
CPC ...... *H01L 27/1225* (2013.01); *H01L 29/4908* (2013.01); *G09G 2300/0426* (2013.01); *H01L 27/3225* (2013.01); *H01L 29/7869* (2013.01)

(58) Field of Classification Search
CPC ............ H01L 27/2436; H01L 29/4908; G09G 3/3225; G09G 3/344; G09G 3/3406; G09G 3/3648; G09G 3/348; G09G 2310/0264; C23C 18/1208; C23C 18/1212; C23C 18/1216; C23C 22/361; C23C 22/367; C23C 22/368; C23C 28/026

See application file for complete search history.

(56) References Cited

U.S. PATENT DOCUMENTS

| | | | |
|---|---|---|---|
| 2006/0113539 A1* | 6/2006 | Sano | H01L 29/51 257/59 |
| 2009/0236596 A1* | 9/2009 | Itai | H01L 29/78618 257/43 |
| 2010/0035379 A1* | 2/2010 | Miyairi | H01L 27/1225 438/104 |
| 2010/0051940 A1* | 3/2010 | Yamazaki | H01L 29/4908 257/43 |
| 2010/0295037 A1* | 11/2010 | Hironaka | H01L 29/78693 257/43 |
| 2011/0128275 A1* | 6/2011 | Ueda | H01L 27/1225 345/212 |
| 2011/0240988 A1 | 10/2011 | Yano et al. | |
| 2011/0284959 A1 | 11/2011 | Kimura et al. | |
| 2012/0037901 A1* | 2/2012 | Mori | H01L 29/78693 257/43 |
| 2013/0240871 A1* | 9/2013 | Shimoda | B41J 2/161 257/43 |
| 2013/0248858 A1* | 9/2013 | Morita | C23C 14/086 257/43 |
| 2014/0054583 A1 | 2/2014 | Uemura et al. | |
| 2014/0061653 A1* | 3/2014 | Kim | H01L 29/66969 257/59 |
| 2014/0319555 A1* | 10/2014 | Prushinskiy | H01L 29/42384 257/91 |
| 2014/0367658 A1* | 12/2014 | Kwak | H01L 23/562 257/40 |
| 2015/0021599 A1* | 1/2015 | Ridgeway | C23C 16/345 257/43 |
| 2015/0028334 A1 | 1/2015 | Matsumoto et al. | |
| 2015/0108454 A1* | 4/2015 | Kim | H01L 29/7869 257/40 |
| 2015/0158300 A1 | 6/2015 | Ueda et al. | |
| 2015/0200209 A1* | 7/2015 | Kim | H01L 29/7869 257/72 |
| 2015/0325707 A1* | 11/2015 | Sano | H01L 21/428 257/43 |
| 2015/0349138 A1 | 12/2015 | Sone et al. | |
| 2016/0013215 A1 | 1/2016 | Ueda et al. | |
| 2016/0027887 A1* | 1/2016 | Yuan | H01L 29/78696 257/43 |
| 2016/0042947 A1 | 2/2016 | Nakamura et al. | |
| 2016/0118501 A1* | 4/2016 | Nabatame | H01L 29/66969 257/43 |
| 2016/0190329 A1 | 6/2016 | Matsumoto et al. | |
| 2016/0267873 A1 | 9/2016 | Saotome et al. | |

FOREIGN PATENT DOCUMENTS

| | | |
|---|---|---|
| JP | 2013-030784 | 2/2013 |
| JP | 2014-022549 | 2/2014 |
| JP | 2014-041958 | 3/2014 |
| JP | 2015-043431 | 3/2015 |
| JP | 2015-111653 | 6/2015 |

* cited by examiner

Light

Light

Light

Light

FIELD-EFFECT TRANSISTOR INCLUDING FIRST AND SECOND GATE INSULATING LAYERS, DISPLAY ELEMENT, IMAGE DISPLAY DEVICE AND SYSTEM INCLUDING FIELD-EFFECT TRANSISTOR

CROSS-REFERENCE TO RELATED APPLICATIONS

The present application claims priority under 35 U.S.C. § 119 to Japanese Patent Application No. 2015-239662, filed Dec. 8, 2015. The contents of which are incorporated herein by reference in their entirety.

BACKGROUND OF THE INVENTION

Field of the Invention

The present disclosure relates to a field-effect transistor, a display element, an image display device, and a system.

Description of the Related Art

Field-effect transistors (FETs) are transistors which control electric current between a source electrode and a drain electrode based on the principle that an electric field is applied to a gate electrode to provide a gate in a flow of electrons or holes utilizing an electric field of a channel.

By virtue of their characteristics, the FETs have been used as, for example, switching elements and amplifying elements. The FETs are low in gate current and have a flat structure, and thus can be easily produced and integrated as compared with bipolar transistors. For these reasons, the FETs are essential elements in integrated circuits used in the existing electronic devices. The FETs have been applied to, for example, active matrix displays as thin film transistor (TFTs).

In recent years, flat panel displays (FPDs), liquid crystal displays (LCDs), organic electroluminescent (EL) displays, and electronic paper have been put into practice.

These FPDs are driven by a driving circuit containing TFTs using amorphous silicon or polycrystalline silicon in an active layer. The FPDs have been required to have an increased size, improved definition and image quality, and an increased driving speed. To this end, there is a need for TFTs that have high carrier mobility, a high on/off ratio, small changes in properties over time, and small variation between the elements.

However, amorphous silicon or polycrystalline silicon have advantages and disadvantages. It was therefore difficult to satisfy all of the above requirements at the same time. In order to respond to these requirements, developments have been actively conducted on TFTs using, in an active layer, an oxide semiconductor the mobility of which can be expected to be higher than amorphous silicon. For example, disclosed is a TFT using $InGaZnO_4$ in a semiconductor layer (see, for example, K. Nomura, and 5 others "Room-temperature fabrication of transparent flexible thin film transistors using amorphous oxide semiconductors", NATURE, VOL. 432, 25, Nov., 2004, pp. 488 to 492 (hereinafter may be referred to as Non-Patent Literature 1)).

In Japanese Unexamined Patent Application Publication No. 2011-216694 (hereinafter may be referred to as Patent Literature 1), an etching stopper layer is formed on an active layer (a semiconductor layer). With this configuration, the active layer does not receive any damage upon etching for a source electrode and a drain electrode because the active layer is protected by the etching stopper layer.

In Japanese Unexamined Patent Application Publication No. 2014-041958 (hereinafter may be referred to as Patent Literature 2), an oxide semiconductor layer is used as an etching stopper in order to prevent a gate insulating layer from being etched upon patterning of a channel passivation layer.

SUMMARY OF THE INVENTION

According to one aspect of the present disclosure, a field-effect transistor includes a gate electrode, which is configured to apply gate voltage, a source electrode and a drain electrode, which are configured to take electric current out, a semiconductor layer, which is disposed to be adjacent to the source electrode and the drain electrode, and a gate insulating layer, which is disposed between the gate electrode and the semiconductor layer. The gate insulating layer includes a first gate insulating layer containing a first oxide containing Si and an alkaline earth metal and a second gate insulating layer disposed to be in contact with the first gate insulating layer and containing a paraelectric amorphous oxide containing a Group A element which is an alkaline earth metal and a Group B element which is at least one selected from the group consisting of Ga, Sc, Y, and lanthanoid.

DESCRIPTION OF THE EMBODIMENTS

Figure 1:
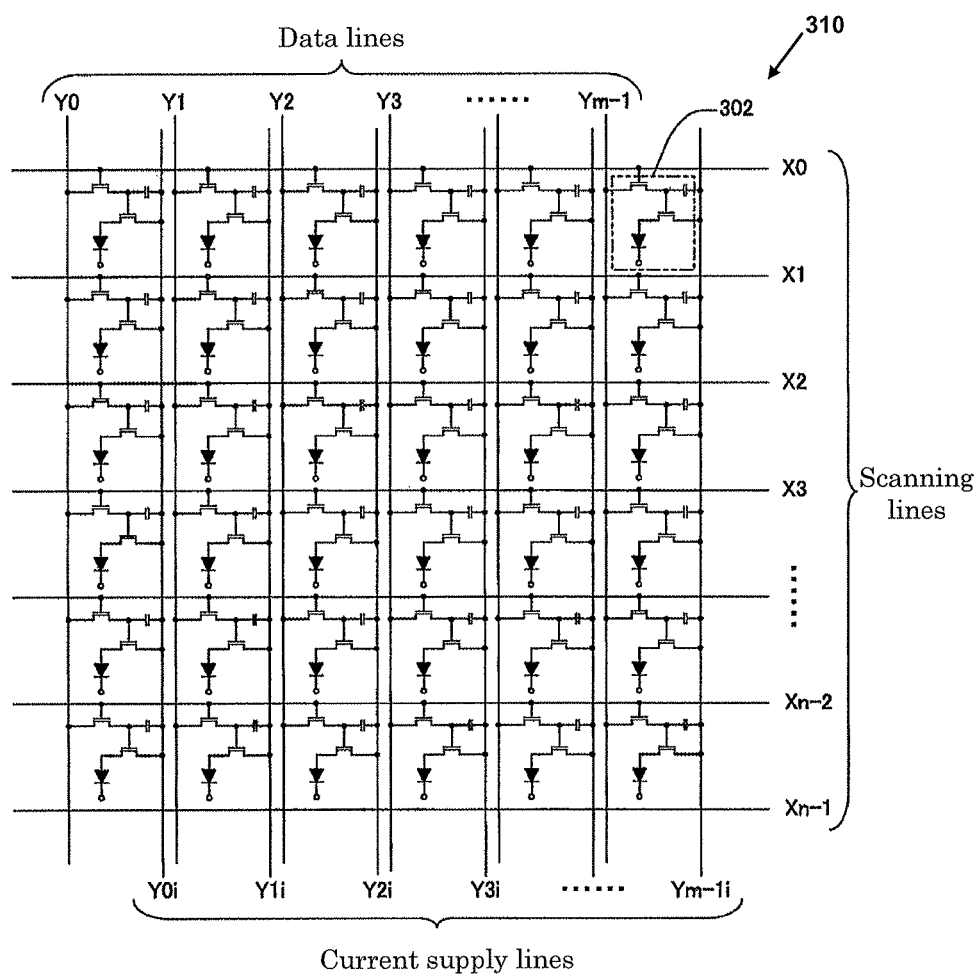
FIG. 1 is a diagram for explaining an image display device.
Figure 1:
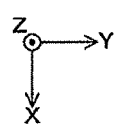

As in the above PTL 1, there is a need to consider etching selectivity between layers in designing the structure of a thin-film transistor. In the thin-film transistor of PTL 1, however, materials of an active layer, an etching stopper layer, a source electrode, and a drain electrode are limited, and the number of choices of materials of the thin-film transistor is low.

In the field-effect transistor of the above PTL 2, materials and shapes of an oxide semiconductor layer, a source electrode, a drain electrode, and a channel passivation layer are limited in order to prevent a gate insulating layer from being etched, and the number of choices of materials and shapes of the field-effect transistor is low.

Therefore, there is a need for achieving more options of materials of a gate electrode, a semiconductor layer, a source electrode, and a drain electrode to be formed in steps subsequent to the formation of a gate insulating layer, to thereby increase the number of choices of configurations, structures, and materials of a field-effect transistor.

Under such circumstances, the present disclosure has an object to provide a field-effect transistor capable of achieving more options of materials of a gate electrode, a semiconductor layer, a source electrode, and a drain electrode to be formed in steps subsequent to the formation of a gate insulating layer, to thereby increase the number of choices of configurations, structures, and materials of a field-effect transistor.

The present disclosure can solve the exiting problems. That is, it is possible to provide a field-effect transistor capable of achieving more options of materials of a gate electrode, a semiconductor layer, a source electrode, and a drain electrode to be formed in steps subsequent to the formation of a gate insulating layer, to thereby increase the number of choices of configurations, structures, and materials of a field-effect transistor.

(Field-Effect Transistor)

A field-effect transistor of the present disclosure includes a gate electrode, a source electrode, a drain electrode, a semiconductor layer, and a gate insulating layer, and further includes other members according to the necessity.

As described below in detail, the field-effect transistor of the present disclosure is that the gate insulating layer includes a first gate insulating layer containing a first oxide containing Si and an alkaline earth metal and a second gate insulating layer disposed to be in contact with the first gate insulating layer and containing a paraelectric amorphous oxide containing a Group A element which is an alkaline earth metal and a Group B element which is at least one selected from the group consisting of Ga, Sc, Y, and lanthanoid.

When the gate insulating layer includes a first gate insulating layer containing a first oxide containing Si and an alkaline earth metal and a second gate insulating layer formed to be in contact with the first gate insulating layer and containing a paraelectric amorphous oxide containing a Group A element which is an alkaline earth metal and a Group B element which is at least one selected from the group consisting of Ga, Sc, Y, and lanthanoid, the gate insulating layer has a structure of two layers different in etching rate. This makes it possible to achieve much more options of materials of a gate electrode, a semiconductor layer, a source electrode, and a drain electrode to be formed in steps subsequent to the formation of a gate insulating layer.

Also, when the gate insulating layer includes a first gate insulating layer containing a first oxide containing Si and an alkaline earth metal and a second gate insulating layer formed to be in contact with the first gate insulating layer and containing a paraelectric amorphous oxide containing a Group A element which is an alkaline earth metal and a Group B element which is at least one selected from the group consisting of Ga, Sc, Y, and lanthanoid, a change in threshold voltage in a BTS (Bias Temperature Stress) test is suppressed. This makes it possible to provide a top gate field-effect transistor exhibiting high reliability.

Also, when the gate insulating layer includes a first gate insulating layer containing a first oxide containing Si and an alkaline earth metal and a second gate insulating layer formed to be in contact with the first gate insulating layer and containing a paraelectric amorphous oxide containing a Group A element which is an alkaline earth metal and a Group B element which is at least one selected from the group consisting of Ga, Sc, Y, and lanthanoid and the semiconductor layer is formed to be in contact with the second gate insulating layer, a change in threshold voltage in a BTS test is suppressed. This makes it possible to provide a field-effect transistor exhibiting high reliability.

<Gate Electrode>

The gate electrode is not particularly limited and may be appropriately selected depending on the intended purpose, so long as the gate electrode is an electrode configured to apply gate voltage to the field-effect transistor.

The gate electrode is in contact with the gate insulating layer and faces the semiconductor layer via the gate insulating layer.

A material of the gate electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANT).

—Formation Method of Gate Electrode—

A formation method of the gate electrode is not particularly limited and may be appropriately selected depending on the intended purpose. Examples of the formation method include: (i) a method of forming a film through sputtering, or dip coating and patterning the film through photolithography; and (ii) a method of directly forming a film having a desired shape through a printing process, such as inkjet printing, nanoimprinting, or gravure printing.

An average film thickness of the gate electrode is not particularly limited and may be appropriately selected depending on the intended purpose. However, the average film thickness of the gate electrode is preferably from 20 nm through 1 μm, more preferably from 50 nm through 300 nm.

<Source Electrode and Drain Electrode>

The source electrode and the drain electrode are not particularly limited and may be appropriately selected depending on the intended purpose, so long as the source electrode and the drain electrode are electrodes configured to take electric current out from the field-effect transistor.

The source electrode and the drain electrode are formed to be in contact with the gate insulating layer.

A material of the source electrode and the drain electrode is not particularly limited and may be appropriately selected depending on the intended purpose. Examples of the material include: metals (e.g., Mo, Al, Au, Ag, and Cu) and alloys of these metals; transparent conductive oxides, such as indium tin oxide (ITO) and antimony-doped tin oxide (ATO); and organic conductors, such as polyethylene dioxythiophene (PEDOT) and polyaniline (PANI).

—Formation Method of Source Electrode and Drain Electrode—

The formation method of the source electrode and the drain electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average film thickness of the source electrode and the drain electrode is not particularly limited and may be appropriately selected depending on the intended purpose. However, the average film thickness is preferably from 20 nm through 1 μm, more preferably from 50 nm through 300 nm.

<Semiconductor Layer>

The semiconductor layer is formed at least between the source electrode and the drain electrode.

Here, the "between" means a position at which the semiconductor layer allows the field-effect transistor to function together with the source electrode and the drain electrode. The position of the semiconductor layer is not particularly limited and may be appropriately selected depending on the intended purpose, so long as the position is the above-described position.

The semiconductor layer is in contact with the gate insulating layer, the source electrode, and the drain electrode.

A material of the semiconductor layer is not particularly limited and may be appropriately selected depending on the intended purpose. Examples of the material include silicon semiconductors and oxide semiconductors.

Examples of the silicon conductors include amorphous silicon and polycrystalline silicon.

Examples of the oxide semiconductors include In—Ga—Zn—O, In—Zn—O, and In—Mg—O.

Among these examples, oxide semiconductors are preferable.

—Formation Method of Semiconductor Layer—

A formation method of the semiconductor layer is not particularly limited and may be appropriately selected depending on the intended purpose. Examples of the formation method include: a method of forming a film through a vacuum process (e.g., sputtering, pulsed laser deposition (PLD), chemical vapor deposition (CVD), or atomic layer deposition (ALD)) or a solution process (e.g., dip coating, spin coating, or die coating) and patterning the film through photolithography; and a method of directly forming a film having a desired shape through a printing method, such as inkjet printing, nanoimprinting, or gravure printing.

An average film thickness of the semiconductor layer is not particularly limited and may be appropriately selected depending on the intended purpose. However, the average film thickness of the semiconductor layer is preferably from 5 nm through 1 μm, more preferably from 10 nm through 0.5 μm.

<Gate Insulating Layer>

The gate insulating layer includes a first gate insulating layer and a second gate insulating layer formed to be in contact with the first gate insulating layer.

Arrangement of the first gate insulating layer and the second gate insulating layer in the gate insulating layer is not particularly limited and may be appropriately selected depending on the intended purpose. The first gate insulating layer may be disposed closer to the semiconductor layer than the second gate insulating layer is to. The second gate insulating layer may be disposed closer to the semiconductor layer than the first gate insulating layer is to. The second gate insulating layer may be disposed so as to cover a top surface and a side surface of the first gate insulating layer. The first gate insulating layer may be disposed so as to cover a top surface and a side surface of the second gate insulating layer.

—First Gate Insulating Layer—

The first gate insulating layer contains a first oxide.

The first gate insulating layer is preferably formed of the first oxide itself.

—First Oxide—

The first oxide contains Si (silicon) and an alkaline earth metal, preferably contains at least one of Al (aluminium) and B (boron), and further contains other component according to the necessity.

In the first oxide, $SiO_2$ formed from the Si forms an amorphous structure. The alkaline earth metal has a function of cleaving a Si—O bond. Therefore, by adjusting a compositional ratio between the Si and the alkaline earth metal, it is possible to control a dielectric constant and a linear expansion coefficient of the first oxide formed.

The first oxide preferably contains at least one of Al and B. $Al_2O_3$ formed from the Al and $B_2O_3$ formed from the B have an amorphous structure similar to $SiO_2$. In the first oxide, therefore, a more stable amorphous structure can be obtained to make it possible to form a more uniform insulating film. The alkaline earth metal changes the coordination structures of Al and B depending on compositional ratios thereof. Thus, it is possible to control a dielectric constant and a linear expansion coefficient of the first oxide formed.

Examples of the alkaline earth metal in the first oxide include Be (beryllium), Mg (magnesium), Ca (calcium), Sr (strontium), and Ba (barium). These alkaline earth metals may be used alone or in combination.

A compositional ratio between the Si and the alkaline earth metal in the first oxide is not particularly limited and may be appropriately selected depending on the intended purpose. However, the compositional ratio is preferably within the following range. In the first oxide, the compositional ratio between the Si and the alkaline earth metal (the Si the alkaline earth metal) is preferably from 50.0 mol % through 90.0 mol % from 10.0 mol % through 50.0 mol % based on the amounts converted to the corresponding oxides ($SiO_2$, BeO, MgO, CaO, SrO, and BaO).

A compositional ratio among the Si, the alkaline earth metal, and at least one of the Al and the B in the first oxide is not particularly limited and may be appropriately selected depending on the intended purpose. However, the compositional ratio is preferably within the following range.

In the first oxide, the compositional ratio among the Si, the alkaline earth metal, and at least one of the Al and the B (the Si the alkaline earth metal at least one of the Al and the B) is preferably from 50.0 mol % through 90.0 mol % from 5.0 mol % through 20.0 mol % from 5.0 mol % through 30.0 mol % based on the amounts converted to the corresponding oxides ($SiO_2$, BeO, MgO, CaO, SrO, BaO, $Al_2O_3$, and $B_2O_3$).

The ratios of the oxides ($SiO_2$, BeO, MgO, CaO, SrO, BaO, $Al_2O_3$, and $B_2O_3$) in the first oxide can be calculated, for example, by analyzing a cationic element of the oxide through X-ray fluorescence spectrometry, electron probe microanalysis (EPMA), or inductively coupled plasma atomic emission spectroscopy (ICP-AES).

A dielectric constant of the first gate insulating layer is not particularly limited and may be appropriately selected depending on the intended purpose.

The dielectric constant can be measured, for example, by producing a capacitor, in which a lower electrode, a dielectric layer (the first gate insulating layer), and an upper electrode are laminated, and measuring the produced capacitor using an LCR meter.

A linear expansion coefficient of the first gate insulating layer is not particularly limited and may be appropriately selected depending on the intended purpose.

The linear expansion coefficient can be measured, for example, by using a thermomechanical analysis device. In this measurement, the linear expansion coefficient can be measured by separately producing a measurement sample having the same composition as the first gate insulating layer, without producing the field-effect transistor.

—Second Gate Insulating Layer—

The second gate insulating layer contains a paraelectric amorphous oxide.

The second gate insulating layer is preferably formed of the paraelectric amorphous oxide itself.

—Paraelectric Amorphous Oxide—

The paraelectric amorphous oxide contains a Group A element which is an alkaline earth metal and a Group B element which is at least one selected from the group consisting of Ga, Sc, Y, and lanthanoid. The paraelectric amorphous oxide preferably contains a Group C element which is at least one of Al (aluminium), Ti (titanium), Zr (zirconium), Hf (hafnium), Nb (niobium), and Ta (tantalum). The paraelectric amorphous oxide further contains other component according to the necessity.

In terms of improvement in characteristics of transistors, it is a preferable embodiment that the second gate insulating layer is formed of an amorphous material. When the second gate insulating layer is formed of a crystalline material, leakage current due to grain boundaries cannot be suppressed to be low, leading to deterioration in transistor characteristics.

Also, it is necessary for the second gate insulating layer to be a paraelectric in terms of reducing hysteresis in transfer characteristics of transistors. Although such a special case that transistors are used for memories and other applications is exceptional, in general, the existence of hysteresis is not preferable in devices utilizing switching characteristics of transistors.

The paraelectric is a dielectric other than a piezoelectric, a pyroelectric, and a ferroelectric. In other words, the paraelectric refers to a dielectric that neither generates polarization by pressure nor has spontaneous polarization in the absence of an external electric field. Also, the piezoelectric, the pyroelectric, and the ferroelectric are needed to be crystals for developing their characteristics. That is, when a gate insulating layer is formed of an amorphous material, this gate insulating layer naturally becomes a paraelectric.

The paraelectric amorphous oxide is stable in the atmosphere and can stably form an amorphous structure in a wide range of compositions.

This results from the finding obtained by the present inventors that oxides containing a Group A element which is an alkaline earth metal and a Group B element which is at least one selected from the group consisting of Ga, Sc, Y, and lanthanoid are stable in the atmosphere and can stably form an amorphous structure in a wide range of compositions.

Typically, simple oxides of alkaline earth metals tend to react with moisture or carbon dioxide in the atmosphere to easily form hydroxides or carbonates and therefore such simple oxides alone are not suitable for use in electronic devices. Moreover, simple oxides of rare-earth elements tend to be crystallized and problematically cause leakage current when attempted to be used in electronic devices. However, the present inventors have found that the paraelectric amorphous oxide containing a Group A element which is an alkaline earth metal and a Group B element which is at least one selected from the group consisting of Ga, Sc, Y, and lanthanoid stably forms an amorphous film in a wide range of compositions. Because the paraelectric amorphous oxide is stably present in a wide range of compositions, a dielectric constant and a linear expansion coefficient of the paraelectric amorphous oxide to be formed can be variably controlled depending on the compositional ratio.

The paraelectric amorphous oxide preferably contains a Group C element which is at least one of Al, Ti, Zr, Hf, Nb, and Ta. When the paraelectric amorphous oxide contains at least one of Al, Ti, Zr, Hf, Nb, and Ta, thermal stability, heat resistance, and denseness can be further improved.

Examples of the Group A element which is an alkaline earth metal in the paraelectric amorphous oxide include Be (beryllium), Mg (magnesium), Ca (calcium), Sr (strontium), and Ba (barium). These alkaline earth metals may be used alone or in combination.

Examples of the Group B element which is at least one selected from the group consisting of Ga, Sc, Y, and lanthanoid in the paraelectric amorphous oxide include Ga (gallium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

A compositional ratio between the Group A element which is an alkaline earth metal and the Group B element which is at least one selected from the group consisting of Ga, Sc, Y, and lanthanoid is not particularly limited and may be appropriately selected depending on the intended purpose. However, the compositional ratio is preferably within the following range.

In the paraelectric amorphous oxide, the compositional ratio between the Group A element which is an alkaline earth metal and the Group B element which is at least one selected from the group consisting of Ga, Sc, Y, and lanthanoid (the Group A element the Group A element) is preferably from 10.0 mol % through 67.0 mol % from 33.0 mol % through 90.0 mol % based on the amounts converted to the corresponding oxides (BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $EU_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$).

A compositional ratio among the Group A element which is an alkaline earth metal, the Group B element which is at least one selected from the group consisting of Ga, Sc, Y, and lanthanoid, and the Group C element which is at least one of Al, Ti, Zr, Hf, Nb, and Ta in the paraelectric amorphous oxide is not particularly limited and may be appropriately selected depending on the intended purpose. However, the compositional ratio is preferably within the following range.

In the paraelectric amorphous oxide, the compositional ratio among the Group A element which is an alkaline earth metal, the Group B element which is at least one selected from the group consisting of Ga, Sc, Y, and lanthanoid, and the Group C element which is at least one of Al, Ti, Zr, Hf, Nb, and Ta (the Group A element:the Group B element:the Group C element) is preferably from 5.0 mol % through 22.0 mol %:from 33.0 mol % through 90.0 mol %:from 5.0 mol % through 45.0 mol % based on the amounts converted to the corresponding oxides (BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Al_2O_3$, $TiO_2$, $ZrO_2$, $HfO_2$, $Nb_2O_5$, and $Ta_2O_5$).

The ratios of the oxides (BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Al_2O_3$, $TiO_2$, $ZrO_2$, $Nb_2O_5$, and $Ta_2O_5$) in the paraelectric amorphous oxide can be calculated, for example, by analyzing a cationic element of the oxide through X-ray fluorescence spectrometry, electron probe microanalysis (EPMA), or inductively coupled plasma atomic emission spectroscopy (ICP-AES).

A dielectric constant of the second gate insulating layer is not particularly limited and may be appropriately selected depending on the intended purpose.

For example, the dielectric constant of the second gate insulating layer can be measured in the same manner as in the measurement of the dielectric constant of the first gate insulating layer.

A linear expansion coefficient of the second gate insulating layer is not particularly limited and may be appropriately selected depending on the intended purpose.

For example, the linear expansion coefficient of the second gate insulating layer can be measured in the same manner as in the measurement of the linear expansion coefficient of the first gate insulating layer.

In the present disclosure, the present inventors have found that when the gate insulating layer is formed to have a laminated structure of the first gate insulating layer and the second gate insulating layer which are different in etching selectivity, it is possible to achieve much more options of materials of a gate electrode, a semiconductor layer, a source electrode, and a drain electrode to be formed in steps subsequent to the formation of the gate insulating layer.

Figure 3A:
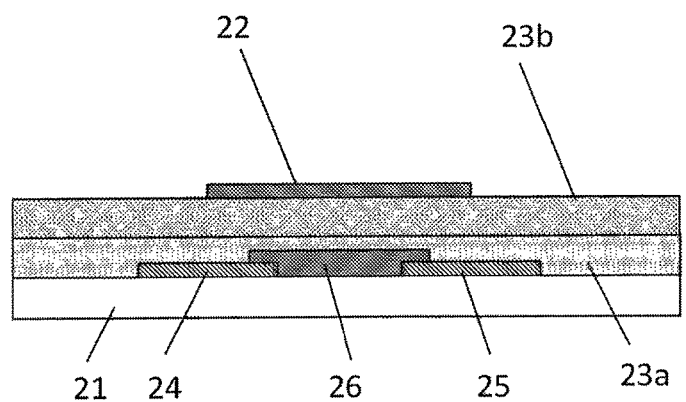
FIG. 3A is a view illustrating one example (bottom contact/top gate) of a field-effect transistor of the present disclosure.
Figure 3B:
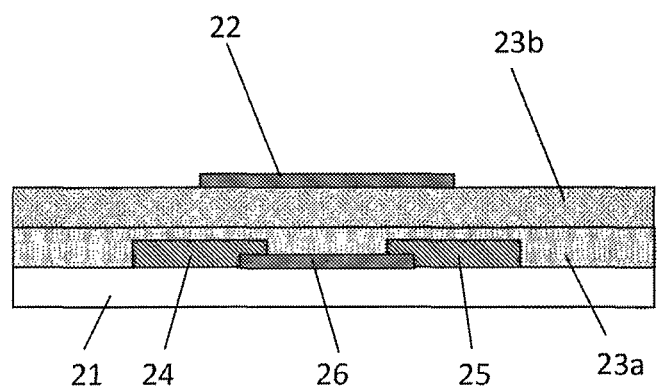
FIG. 3B is a view illustrating one example (top contact/top gate) of a field-effect transistor of the present disclosure.

In the top gate field-effect transistors illustrated in FIG. 3A and FIG. 3B, the second gate insulating layer can prevent the first gate insulating layer from being etched in etching of the gate electrode on the gate insulating layer. Therefore, the material etching the gate insulating layer upon etching of the gate electrode can also be used as the gate electrode.

Figure 3C:
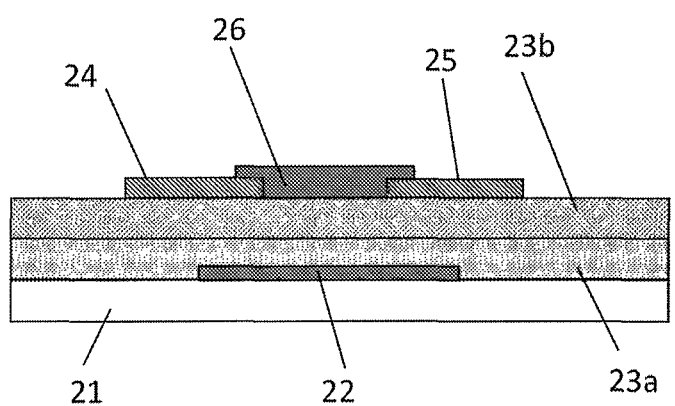
FIG. 3C is a view illustrating one example (bottom contact/bottom gate) of a field-effect transistor of the present disclosure.
Figure 3D:
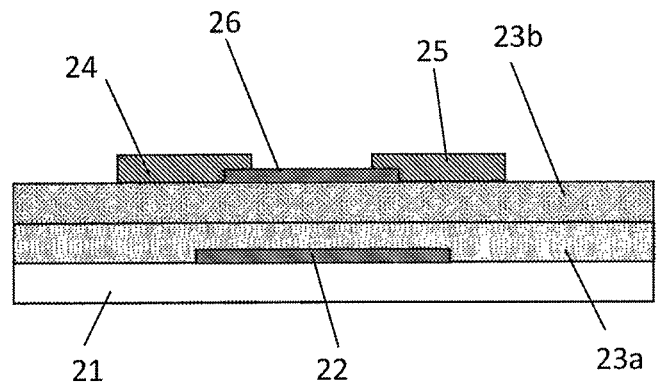
FIG. 3D is a view illustrating one example (top contact/bottom gate) of a field-effect transistor of the present disclosure.

In the bottom gate field-effect transistors illustrated in FIG. 3C and FIG. 3D, the second gate insulating layer can prevent the first gate insulating layer from being etched in etching of the source electrode, the drain electrode, and the semiconductor layer on the gate insulating layer.

Therefore, the material etching the gate insulating layer upon etching of the source electrode, the drain electrode, and the semiconductor layer can also be used as the source electrode, the drain electrode, and the semiconductor layer.

Figure 3E:
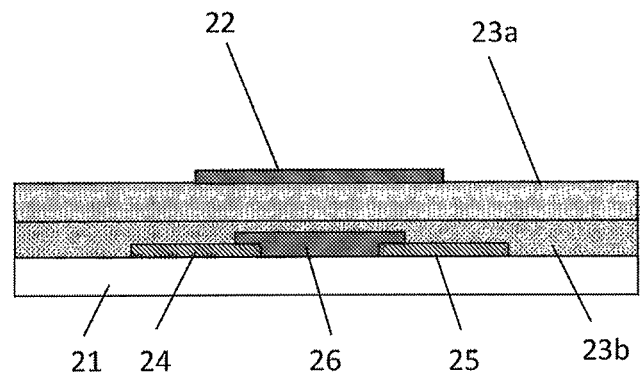
FIG. 3E is a view illustrating one example (bottom contact/top gate) of a field-effect transistor of the present disclosure.
Figure 3F:
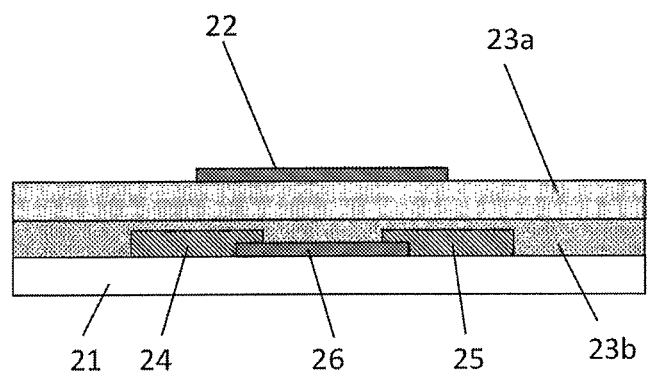
FIG. 3F is a view illustrating one example (top contact/top gate) of a field-effect transistor of the present disclosure.

In the top gate field-effect transistors illustrated in FIG. 3E and FIG. 3F, the first gate insulating layer can prevent the second gate insulating layer from being etched in etching of the gate electrode on the gate insulating layer. Therefore, the material etching the gate insulating layer upon etching of the gate electrode can also be used as the gate electrode.

Figure 3G:
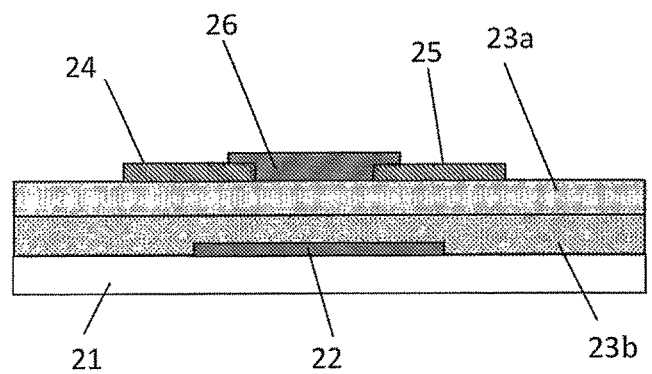
FIG. 3G is a view illustrating one example (bottom contact/bottom gate) of a field-effect transistor of the present disclosure.
Figure 3H:
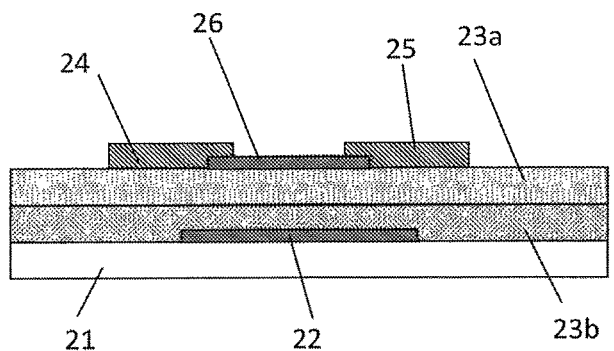
FIG. 3H is a view illustrating one example (top contact/bottom gate) of a field-effect transistor of the present disclosure.

In the bottom gate field-effect transistors illustrated in FIG. 3G and FIG. 3H, the first gate insulating layer can prevent the second gate insulating layer from being etched in etching of the source electrode, the drain electrode, and the semiconductor layer on the gate insulating layer. Therefore, the material etching the gate insulating layer upon etching of the source electrode, the drain electrode, and the semiconductor layer can also be used as the source electrode, the drain electrode, and the semiconductor layer.

The present inventors have found that when the gate insulating layer is formed to have a laminated structure of the first gate insulating layer and the second gate insulating layer formed to be in contact with the first gate insulating layer, the gate insulating layer has excellent barrier properties against moisture, oxygen, and hydrogen contained in the atmosphere. Therefore, in a top gate field-effect transistor using the gate insulating layer, the gate insulating layer separates moisture, oxygen, and hydrogen contained in the atmosphere from the semiconductor layer. This makes it possible to provide a field-effect transistor having a smaller change in threshold voltage in a BTS test even in the absence of a passivation layer and exhibiting high reliability.

Also, the present inventors have found that when the gate insulating layer is formed to have a laminated structure of the first gate insulating layer and the second gate insulating layer formed to be in contact with the first gate insulating layer and the second gate insulating layer is disposed to be in contact with the semiconductor layer, it is possible to create a structure having less defects in the interface between the gate insulating layer and the semiconductor layer. Therefore, combination of the gate insulating layer and the semiconductor layer can provide a field-effect transistor having less defects in the interface between the gate insulating layer and the semiconductor layer, having a smaller change in threshold voltage in a BTS test, and exhibiting high reliability. Also, use of an oxide semiconductor in the semiconductor layer can provide a field-effect transistor having much less defects in the interface between the gate insulating layer and the semiconductor layer, having a much smaller change in threshold voltage in a BTS test, and exhibiting high reliability.

—Formation Method of First Gate Insulating Layer and Second Gate Insulating Layer—

A formation method of the first gate insulating layer and the second gate insulating layer is not particularly limited and may be appropriately selected depending on the intended purpose. Examples of the formation method include a method of forming a film by a vacuum process, such as sputtering, pulsed laser deposition (PLD), chemical vapor deposition (CVD), or atomic layer deposition (ALD) and patterning the film through photolithography.

Moreover, the first gate insulating layer can be formed by preparing a coating liquid containing a precursor of the first oxide (a first-gate-insulating-layer-coating liquid), coating or printing the coating liquid onto an object to be coated, and baking the resultant under appropriate conditions. Similarly, the second gate insulating layer can be formed by preparing a coating liquid containing a precursor of the paraelectric amorphous oxide (a second-gate-insulating-layer-coating liquid), coating or printing the coating liquid onto an object to be coated, and baking the resultant under appropriate conditions.

An average film thickness of the first gate insulating layer is preferably from 10 nm through 1,000 nm, more preferably from 20 nm through 500 nm. An average film thickness of the second gate insulating layer is preferably from 10 nm through 1,000 nm, more preferably from 20 nm through 500 nm.

—First-Gate-Insulating-Layer-Coating Liquid—

The first-gate-insulating-layer-coating liquid contains a silicon-containing compound, an alkaline earth metal compound, and a solvent, preferably contains at least one selected from the group consisting of an aluminium-containing compound and a boron-containing compound, and further contains other component according to the necessity.

—Silicon-Containing Compound—

Examples of the silicon-containing compound include inorganic silicon compounds and organic silicon compounds.

Examples of the inorganic silicon compounds include tetrachlorosilane, tetrabromosilane, and tetraiodosilane.

The organic silicon compounds are not particularly limited and may be appropriately selected depending on the intended purpose, so long as the organic silicon compounds are each a compound containing silicon and an organic group. The silicon and the organic group are bonded, for example, via an ionic bond, a covalent bond, or a coordinate bond.

The organic group is not particularly limited and may be appropriately selected depending on the intended purpose. Examples of the organic group include alkyl groups which may have a substituent, alkoxy groups which may have substituents, acyloxy groups which may have substituents, and phenyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the organic silicon compounds include tetramethoxysilane, tetraethoxysilane, tetraisopropoxysilane, tetrabutoxysilane, 1,1,1,3,3,3-hexamethyldisilazane (HMDS), bis(trimethylsilyl)acetylene, triphenylsilane; silicon 2-ethylhexanoate, and tetraacetoxysilane.

An amount of the silicon-containing compound in the first-gate-insulating-layer-coating liquid is not particularly limited and may be appropriately selected depending on the intended purpose.

—Alkaline-Earth-Metal-Containing Compound—

Examples of the alkaline-earth-metal-containing compound include inorganic alkaline earth metal compounds and organic alkaline earth metal compounds. Examples of alkaline earth metals in the alkaline-earth-metal-containing compound include Be (beryllium), Mg (magnesium), Ca (calcium), Sr (strontium), and Ba (barium).

Examples of the inorganic alkaline earth metal compounds include alkaline earth metal nitrate, alkaline earth metal sulfate, alkaline earth metal chlorides, alkaline earth metal fluorides, alkaline earth metal bromides, and alkaline earth metal iodides.

Examples of the alkaline earth metal nitrate include magnesium nitrate, calcium nitrate, strontium nitrate, and barium nitrate.

Examples of the alkaline earth metal sulfate include magnesium sulfate, calcium sulfate, strontium sulfate, and barium sulfate.

Examples of the alkaline earth metal chlorides include magnesium chloride, calcium chloride, strontium chloride, and barium chloride.

Examples of the alkaline earth metal fluorides include magnesium fluoride, calcium fluoride, strontium fluoride, and barium fluoride.

Examples of the alkaline earth metal bromides include magnesium bromide, calcium bromide, strontium bromide, and barium bromide.

Examples of the alkaline earth metal iodides include magnesium iodide, calcium iodide, strontium iodide, and barium iodide.

The organic alkaline earth metal compounds are not particularly limited and may be appropriately selected depending on the intended purpose, so long as the organic alkaline earth metal compounds are each a compound containing an alkaline earth metal and an organic group. The alkaline earth metal and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, phenyl groups which may have substituents, acetyl acetonate groups which may have substituents, and sulfonic acid groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include: acyloxy groups containing from 1 through 10 carbon atoms; acyloxy groups part of which is substituted with a benzene ring, such as benzoic acid; acyloxy groups part of which is substituted with a hydroxyl group, such as lactic acid; and acyloxy groups containing two or more carbonyl groups, such as oxalic acid and citric acid.

Examples of the organic alkaline earth metal compound include magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluromethanesulfonate, calcium methoxide, calcium ethoxide, calcium acetate, calcium formate, acetylacetone calcium, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, barium trifluoromethane-sulfonate, and bis(acetylacetonato) beryllium. An amount of the alkaline-earth-metal-containing compound in the first-gate-insulating-layer-coating liquid is not particularly limited and may be appropriately selected depending on the intended purpose. —Aluminium-Containing Compound—

Examples of the aluminium-containing compound include inorganic aluminium compounds and organic aluminium compounds.

Examples of the inorganic aluminium compounds include aluminium chloride, aluminium nitrate, aluminium bromide, aluminium hydroxide, aluminium borate, aluminium trifluoride, aluminium iodide, aluminium sulfate, aluminium phosphate, and aluminium ammonium sulfate.

The organic aluminium compounds are not particularly limited and may be appropriately selected depending on the intended purpose, so long as the organic aluminium compounds are each a compound containing aluminium and an organic group. The aluminium and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and sulfonic acid groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include: acyloxy groups containing from 1 through 10 carbon atoms; acyloxy groups part of which is substituted with a benzene ring, such as benzoic acid; acyloxy groups part of which is substituted with a hydroxyl group, such as lactic acid; and acyloxy groups containing two or more carbonyl groups, such as oxalic acid and citric acid.

Examples of the organic aluminium compounds include aluminium isopropoxide, aluminium-sec-butoxide, triethylaluminium, diethylaluminium ethoxide, aluminium acetate, acetylacetone aluminium, aluminium hexafluoroacetonate, aluminium 2-ethylhexanate, aluminium lactate, aluminium benzoate, aluminium di(s-butoxide)acetoacetate ester chelate, and aluminium trifluoromethanesulfonate.

An amount of the aluminium-containing compound in the first-gate-insulating-layer-coating liquid is not particularly limited and may be appropriately selected depending on the intended purpose.
—Boron-Containing Compound—

Examples of the boron-containing compound include inorganic boron compounds and organic boron compounds.

Examples of the inorganic boron compounds include orthoboric acid, boron oxide, boron tribromide, tetrafluoroboric acid, ammonium borate, and magnesium borate. Examples of the boron oxide include diboron dioxide, diboron trioxide, tetraboron trioxide, and tetraboron pentaoxide.

The organic boron compounds are not particularly limited and may be appropriately selected depending on the intended purpose, so long as the organic boron compounds are each a compound containing boron and an organic group. The boron and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, phenyl groups which may have substituents, sulfonic acid groups which may have substituents, and thiophene groups which may have substituents. Examples of the alkyl groups include alkyl groups containing from 1 through 6 carbon atoms. Examples of the alkoxy groups include alkoxy groups containing from 1 through 6 carbon atoms. The alkoxy groups also include organic groups each containing two or more oxygen atoms whose two oxygen atoms are bonded to boron and form a ring structure together with boron. The alkoxy groups also include the above-described alkoxy groups whose alkyl groups have been replaced with organic silyl groups. Examples of the acyloxy groups include acyloxy groups containing from 1 through 10 carbon atoms.

Examples of the organic boron compounds include (R)-5,5-diphenyl-2-methyl-3,4-propano-1,3,2-oxazaborolidine, triisopropyl borate, 2-isopropoxy-4,4,5,5-tetramethyl-1,3,2-clioxaborolane, bis(hexylene glycolato)diboron, 4-(4,4,5,5-tetramethyl-1,3,2-dioxaborolan-2-yl)-1H-pyrazole, (4,4,5,5-tetramethyl-1,3,2-dioxaborolan-2-yl)benzene, tert-butyl-N-[4-(4,4,5,5-tetramethyl-1,2,3-dioxaborolan-2-yl)phenyl] carbamate, phenylboronic acid, 3-acetylphenylboronic acid, boron trifluoride-acetic acid complex, boron trifluoride-sulfolane complex, 2-thiopheneboronic acid, and tris(trimethylsilyl)borate.

An amount of the boron-containing compound in the first-gate-insulating-layer-coating liquid is not particularly limited and may be appropriately selected depending on the intended purpose.
—Solvent—

The solvent is not particularly limited and may be appropriately selected depending on the intended purpose, so long as the solvent is capable of stably dissolving or dispersing the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethyl hexanoate, mineral spirits, dimethylpropylene urea, 4-butyrolactone, 2-methoxy ethanol, and water.

An amount of the solvent in the first-gate-insulating-layer-coating liquid is not particularly limited and may be appropriately selected depending on the intended purpose.

A compositional ratio between the silicon-containing compound and the alkaline-earth-metal-containing compound (the silicon-containing compound the alkaline-earth-metal-containing compound) in the first-gate-insulating-layer-coating liquid is not particularly limited and may be appropriately selected depending on the intended purpose. However, the compositional ratio is preferably within the following range.

In the first-gate-insulating-layer-coating liquid, the compositional ratio between the Si and the alkaline earth metal (the Si the alkaline earth metal) is preferably from 50.0 mol % through 90.0 mol % from 10.0 mol % through 50.0 mol % based on the amounts converted to the corresponding oxides ($SiO_2$, BeO, MgO, CaO, SrO, and BaO).

A compositional ratio among the silicon-containing compound, the alkaline-earth-metal-containing compound, and at least one selected from the group consisting of the aluminium-containing compound and the boron-containing compound (the silicon-containing compound: the alkaline-earth-metal-containing compound: at least one selected from the group consisting of the aluminium-containing compound and the boron-containing compound) in the first-gate-insulating-layer-coating liquid is not particularly limited and may be appropriately selected depending on the intended purpose. However, the compositional ratio is preferably within the following range.

In the first-gate-insulating-layer-coating liquid, the compositional ratio among the Si, the alkaline earth metal, and at least one of the Al and the B (the Si: the alkaline earth metal: at least one of the Al and the B) is preferably from 50.0 mol % through 90.0 mol %: from 5.0 mol % through 20.0 mol %: from 5.0 mol % through 30.0 mol % based on the amounts converted to the corresponding oxides ($SiO_2$, BeO, MgO, CaO, SrO, BaO, $Al_2O_3$, and $B_2O_3$).

—Second-Gate-Insulating-Layer-Coating Liquid—

The second-gate-insulating-layer-coating liquid contains an alkaline-earth-metal-containing compound (a Group-A-element-containing compound), a Group-B-element-containing compound, and a solvent, preferably contains a Group-C-element-containing compound, and further contains other component according to the necessity.

—Alkaline-Earth-Metal-Containing Compound (Group-A-Element-Containing Compound)—

Examples of the alkaline-earth-metal-containing compound include inorganic alkaline earth metal compounds and organic alkaline earth metal compounds. Examples of alkaline earth metals in the alkaline-earth-metal-containing compound include Be (beryllium), Mg (magnesium), Ca (calcium), Sr (strontium), and Ba (barium).

The organic group is not particularly limited and may be appropriately selected depending on the intended purpose. Examples of the organic group include alkyl groups which may have substituents, alkoxy groups which may have substituents, acyloxy groups which may have substituents, phenyl groups which may have substituents, acetyl acetonate groups which may have substituents, and sulfonic acid groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include: acyloxy groups containing from 1 through 10 carbon atoms; acyloxy groups part of which is substituted with a benzene ring, such as benzoic acid; acyloxy groups part of which is substituted with a hydroxyl group, such as lactic acid; and acyloxy groups containing two or more carbonyl groups, such as oxalic acid and citric acid.

The organic alkaline earth metal compounds are not particularly limited and may be appropriately selected depending on the intended purpose, so long as the organic alkaline earth metal compounds are each a compound containing an alkaline earth metal and an organic group. The alkaline earth metal and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, phenyl groups which may have substituents, acetyl acetonate groups which may have substituents, and sulfonic acid groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include: acyloxy groups containing from 1 through 10 carbon atoms; acyloxy groups part of which is substituted with a benzene ring, such as benzoic acid; acyloxy groups part of which is substituted with a hydroxyl group, such as lactic acid; and acyloxy groups containing two or more carbonyl groups, such as oxalic acid and citric acid.

Examples of the organic alkaline earth metal compound include magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluoromethanesulfonate, calcium methoxide, calcium ethoxide, calcium acetate, calcium formate, acetylacetone calcium, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, barium trifluoromethane-sulfonate, and bis(acetylacetonato) beryllium.

An amount of the alkaline-earth-metal-containing compound in the second-gate-inslulating-layer-coating liquid is not particularly limited and may be appropriately selected depending on the intended purpose.

—Group-B-Element-Containing Compound—

Examples of rare-earth elements in the Group-B-element-containing compound include Ga (gallium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

Examples of the Group-B-element-containing compound include inorganic Group-B-element-containing compounds and organic Group-B-element-containing compounds.

Examples of the inorganic Group-B-element-containing compounds include nitrates of the Group B elements, sulfates of the Group B elements, fluorides of the Group B elements, chlorides of the Group B elements, bromides of the Group B elements, and iodides of the Group B elements.

Examples of the nitrates of the Group B elements include gallium nitrate, scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, and lutetium nitrate.

Examples of the sulfates of the Group B elements include gallium sulfate, scandium sulfate, yttrium sulfate, lanthanum sulfate, cerium sulfate, praseodymium sulfate, neodymium sulfate, samarium sulfate, europium sulfate, gadolinium sulfate, terbium sulfate, dysprosium sulfate, holmium sulfate, erbium sulfate, thulium sulfate, ytterbium sulfate, and lutetium sulfate.

Examples of the fluorides of the Group B elements include gallium fluoride, scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, and lutetium fluoride.

Examples of the chlorides of the Group B elements include gallium chloride, scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, and lutetium chloride.

Examples of the bromides of the Group B elements include gallium bromide, scandium bromide, yttrium bromide, lanthanum bromide, cerium bromide, praseodymium bromide, neodymium bromide, samarium bromide, europium bromide, gadolinium bromide, terbium bromide, dysprosium bromide, holmium bromide, erbium bromide, thulium bromide, ytterbium bromide, and lutetium bromide.

Examples of the iodides of the Group B elements include gallium iodide, scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, and lutetium iodide.

The organic Group-B-element-containing compound is not particularly limited and may be appropriately selected depending on the intended purpose, so long as the organic Group-B-element-containing is a compound containing a Group B element and an organic group. The Group B element and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the organic Group-B-element-containing compound include tris(cyclopentadienyl)gallium, scandium isopropoxide, scandium acetate, tris(cyclopentadienyl)scandium, yttrium isopropoxide, yttrium 2-ethylhexanoate, tris(acetylacetonato)yttrium, tris(cyclopentadienyl)yttrium, lanthanum isopropoxide, lanthanum 2-ethylhexanoate, tris(acetylacetonato)lanthanum, tris(cyclopentadienyl)lanthanum, cerium 2-ethylhexanoate, tris(acetylacetonato)cerium, tris(cyclopentadienyl)cerium, praseodymium isopropoxide, praseodymium oxalate, tris(acetylacetonato)praseodymium, tris(cyclopentadienyl)praseodymium, neodymium isopropoxide, neodymium 2-ethylhexanoate, neodymium trifluoroacetylacetonate, tris(isopropylcyclopentadienyDneodymium, tris(ethylcyclopentadienyl)promethium, samarium isopropoxide, samarium 2-ethylhexanoate, tris(acetylacetonato)samarium, tris(cyclopentadienynsamarium, europium 2-ethylhexanoate, tris(acetylacetonato)europium, tris(ethylcyclopentadienyl)europium, gadolinium isopropoxide, gadolinium 2-ethylhexanoate, tris(acetylacetonato)gadolinium, tris(cyclopentadienyngadolinium, terbium acetate, tris(acetylacetonato)terbium, tris(cyclopentadienyl)terbium, dysprosium isopropoxide, dysprosium acetate, tris(acetylacetonato)dysprosium, tris(ethylcyclopentadienyOdysprosium, holmium isopropoxide, holmium acetate, tris(cyclopentadienyl)holmium, erbium isopropoxide, erbium acetate, tris(acetylacetonato)erbium, tris(cyclopentadienyl)erbium, thulium acetate, tris(acetylacetonato)thulium, tris(cyclopentadienyl)thulium, ytterbium isopropoxide, ytterbium acetate, tris(acetylacetonato)ytterbium, tris(cyclopentadienyl)ytterbium, lutetium oxalate, and tris(ethylcyclopentadienyl)lutetium.

An amount of the Group-B-element-containing compound in the second-gate-insulating-layer-coating liquid is not particularly limited and may be appropriately selected depending on the intended purpose.

—Group-C-Element-Containing Compound—

Examples of the Group C element include Al (aluminium), Ti (titanium), Zr (zirconium), Hf (hafnium), Nb (niobium), and Ta (tantalum).

Examples of the Group-C-element-containing compound include inorganic compounds of the Group C elements and organic compounds of the Group C elements.

Examples of the inorganic compounds of the Group C elements include nitrates of the Group C elements, sulfates of the Group C elements, fluorides of the Group C elements, chlorides of the Group C elements, bromides of the Group C elements, and iodides of the Group C elements.

The organic compounds of the Group C elements are not particularly limited and may be appropriately selected depending on the intended purpose, so long as the organic compounds of the Group C elements are each a compound containing a Group C element and an organic group. The Group C element and the organic group are bonded, for example, via an ionic bond, a covalent bond, or a coordinate bond.

The organic group is not particularly limited and may be appropriately selected depending on the intended purpose. Examples of the organic group include alkyl groups which may have substituents, alkoxy groups which may have substituents, acyloxy groups which may have substituents, acetyl acetonate groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

—Solvent—

The solvent is not particularly limited and may be appropriately selected depending on the intended purpose, so long as the solvent is capable of stably dissolving or dispersing the above various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecahe, tetralin, decalin, isopropanol, ethyl benzoate, N, N-dimethylformamide, propylene carbonate, 2-ethyl hexanoate, mineral spirits, dimethylpropylene urea, 4-butyrolactone, 2-methoxy ethanol, and water.

An amount of the solvent in the second-gate-insulating-layer-coating liquid is not particularly limited and may be appropriately selected depending on the intended purpose. A compositional ratio between the alkaline-earth-metal-containing compound (the Group-A-element-containing compound) and the Group-B-element-containing compound (the Group-A-element-containing compound: the Group-B-element-containing compound) in the second-gate-insulating-layer-coating liquid is not particularly limited and may be appropriately selected depending on the intended purpose. However, the compositional ratio is preferably within the following range.

In the second-gate-insulating-layer-coating liquid, the compositional ratio between the Group A element which is an alkaline earth metal and the Group B element which is at least one selected from the group consisting of Ga, Sc, Y, and lanthanoid (the Group A element the Group B element) is preferably from 10.0 mol % through 67.0 mol % from 33.0 mol % through 90.0 mol % based on the amounts converted to the corresponding oxides (BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, and $Lu_2O_3$).

A compositional ratio among the alkaline-earth-metal-containing compound (the Group-A-element-containing compound), the Group-B-element-containing compound, and the Group-C-element-containing compound (the Group-A-element-containing compound: the Group-B-element-containing compound: the Group-C-element-containing compound) in the second-gate-insulating-layer-coating liquid is not particularly limited and may be appropriately selected depending on the intended purpose. However, the compositional ratio is preferably within the following range.

In the second-gate-insulating-layer-coating liquid, the compositional ratio among the Group A element which is an alkaline earth metal, the Group B element which is at least one selected from the group consisting of Ga, Sc, Y, and lanthanoid, and the Group C element which is at least one of Al, Ti, Zr, Hf, Nb, and Ta (the Group A element the Group B element: the Group C element) is preferably from 5.0 mol % through 22.0 mol %: from 33.0 mol % through 90.0 mol: from 5.0 mol % through 45.0 mol % based on the amounts converted to the corresponding oxides (BeO, MgO, CaO, SrO, BaO, $Ga_2O_3$, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $Al_2O_3$, $TiO_2$, $ZrO_2$, $HfO_2$, $Nb_2O_5$, and $Ta_2O_5$).

—Formation Method of First Gate Insulating Layer Using First-Gate-Insulating-Layer-Coating Liquid and Formation Method of Second Gate Insulating Layer Using Second-Gate-Insulating-Layer-Coating Liquid—

One example of a formation method of the first gate insulating layer using the first-gate-insulating-layer-coating liquid and one example of a formation method of the second gate insulating layer using the second-gate-insulating-layer-coating liquid will be described. The formation method of the first gate insulating layer and the second gate insulating layer contains a coating step and a heat treatment step and further contains other steps according to the necessity.

The coating step is not particularly limited and may be appropriately selected depending on the intended purpose, so long as the coating step is a step of coating the first-gate-insulating-layer-coating liquid or the second-gate-insulating-layer-coating liquid onto an object to be coated. A method of the coating is not particularly limited and may be appropriately selected depending on the intended purpose. Examples of the method include: a method of forming a film through a solution process and patterning the film through photolithography; and a method of directly forming a film having a desired shape by printing, such as inkjet printing, nanoimprinting, or gravure printing. Examples of the solution process include dip coating, spin coating, die coating, and nozzle printing.

The heat treatment step is not particularly limited and may be appropriately selected depending on the intended purpose, so long as the heat treatment step is a step of heat-treating the first-gate-insulating-layer-coating liquid or the second-gate-insulating-layer-coating liquid coated on the object to be coated. Note that, in the heat treatment step, the first-gate-insulating-layer-coating liquid or the second-gate-insulating-layer-coating liquid coated on the object to be coated may be dried through air drying. As a result of the heat treatment, the solvent is evaporated and the oxide (the first oxide or the paraelectric amorphous oxide) is generated.

In the heat treatment step, evaporation of the solvent (hereinafter referred to as "evaporation treatment") and generation of the first oxide or the paraelectric amorphous oxide (hereinafter referred to as "generation treatment") are preferably performed at different temperatures. Specifically, it is preferable that after the evaporation of the solvent, the temperature be elevated to generate the first oxide or the paraelectric amorphous oxide. At the time of generation of the first oxide, for example, at least one selected from the group consisting of the silicon-containing compound, the alkaline-earth-metal-containing compound, the aluminium-containing compound, and the boron-containing compound is decomposed. At the time of generation of the paraelectric amorphous oxide, for example, at least one selected from the group consisting of the alkaline-earth-metal-containing compound, the rare-earth-element-containing compound, the zirconium-containing compound, and the hafnium-containing compound is decomposed.

A temperature of the evaporation treatment is not particularly limited and may be appropriately selected depending on the solvent contained. For example, the temperature of the evaporation treatment is from 80° C. through 180° C. As for the evaporation, it is effective to use a vacuum oven for reducing the required temperature. A time of the evaporation treatment is not particularly limited and may be appropriately selected depending on the intended purpose. For example, the time of the evaporation treatment is from 10 minutes through 1 hour.

A temperature of the generation treatment is not particularly limited and may be appropriately selected depending on the intended purpose. However, the temperature of the generation treatment is preferably 100° C. or higher but lower than 550° C., more preferably from 200° C. through 500° C. The time of the generation treatment is not particularly limited and may be appropriately selected depending on the intended purpose. For example, the time of the generation treatment is from 1 hour through 5 hours.

Note that, in the heat treatment step, the evaporation treatment and the generation treatment may be continuously performed or may be performed in a divided manner of a plurality of steps.

A method of the heat treatment is not particularly limited and may be appropriately selected depending on the intended purpose.

Examples of the method of the heat treatment include a method of heating the object to be coated. An atmosphere in the heat treatment is not particularly limited and may be appropriately selected depending on the intended purpose. However, the atmosphere is preferably an oxygen atmosphere. When the heat treatment is performed in the oxygen atmosphere, decomposed products can be promptly discharged to the outside of the system and generation of the first oxide or the paraelectric amorphous oxide can be accelerated.

In the heat treatment, in view of acceleration of reaction of the generation treatment, it is effective to apply ultraviolet rays having a wavelength of 400 nm or shorter to the material after the evaporation treatment. Applying the ultraviolet rays having a wavelength of 400 nm or shorter can cleave chemical bonds of the organic material contained in the material after the evaporation treatment and can decompose the organic material. Therefore, the first oxide or the paraelectric amorphous oxide can be efficiently formed. The ultraviolet rays having a wavelength of 400 nm or shorter are not particularly limited and may be appropriately selected depending on the intended purpose. Examples of the ultraviolet rays include ultraviolet rays having a wavelength of 222 nm emitted from an excimer lamp. It is also preferable to apply ozone instead of or in combination with the ultraviolet rays. Applying the ozone to the material after the evaporation treatment accelerates generation of the oxide.

A structure of the field-effect transistor is not particularly limited and may be appropriately selected depending on the intended purpose. Examples of the structure of the field-effect transistor include the following structures:

(1) a field-effect transistor containing the substrate, the source electrode and the drain electrode formed on the substrate, the semiconductor layer formed between the source electrode and the drain electrode, the first gate insulating layer formed on the source electrode, the drain electrode, and the semiconductor layer, the second gate insulating layer formed on the first gate insulating layer, and the gate electrode formed on the second gate insulating layer;

(2) a field-effect transistor containing the substrate, the gate electrode formed on the substrate, the first gate insulating layer formed on the gate electrode, the second gate insulating layer formed on the first gate insulating layer, the source electrode and the drain electrode formed on the second gate insulating layer, and the semiconductor layer formed between the source electrode and the drain electrode;

(3) a field-effect transistor containing the substrate, the source electrode and the drain electrode formed on the substrate, the semiconductor layer formed between the source electrode and the drain electrode, the second gate insulating layer formed on the source electrode, the drain electrode, and the semiconductor layer, the first gate insulating layer formed on the second gate insulating layer, and the gate electrode formed on the first gate insulating layer; and (4) a field-effect transistor containing the substrate, the gate electrode formed on the substrate, the second gate insulating layer formed on the gate electrode, the first gate insulating layer formed on the second gate insulating layer, the source electrode and the drain electrode formed on the first gate insulating layer, and the semiconductor layer formed between the source electrode and the drain electrode.

Examples of the field-effect transistor having the structure of (1) include a bottom contact/top gate field-effect transistor (FIG. 3A) and a top contact/top gate field-effect transistor (FIG. 3B).

Examples of the field-effect transistor having the structure of (2) include a bottom contact/bottom gate field-effect transistor (FIG. 3C) and a top contact/bottom gate field-effect transistor (FIG. 3D).

Examples of the field-effect transistor having the structure of (3) include a bottom contact/top gate field-effect transistor (FIG. 3E) and a top contact/top gate field-effect transistor (FIG. 3F).

Examples of the field-effect transistor having the structure of (4) include a bottom contact/bottom gate field-effect transistor (FIG. 3G) and a top contact/bottom gate field-effect transistor (FIG. 3H).

In FIGS. 3A to 3H, reference numeral 21 denotes a substrate, 22 denotes a gate electrode, 23a denotes a first gate insulating layer, 23b denotes a second gate insulating layer, 24 denotes a source electrode, 25 denotes a drain electrode, and 26 denotes a semiconductor layer.

The field-effect transistor is suitably used in the display element described below, but use of the field-effect transistor is not limited to the use in the display element. For example, the field-effect transistor can be used for IC cards and ID tags.

(Display Element)

A display element of the present disclosure contains at least a light control element and a driving circuit configured to drive the light control element and further contains other members according to the necessity.

<Light Control Element>

The light control element is not particularly limited and may be appropriately selected depending on the intended purpose, so long as the light control element is an element configured to control light output according to a driving signal. Examples of the light control element include electroluminescent (EL) elements, electrochromic (EC) elements, liquid crystal elements, electrophoretic elements, and electrowetting elements.

<Driving Circuit>

The driving circuit is not particularly limited and may be appropriately selected depending on the intended purpose, so long as the driving circuit is a circuit containing the field-effect transistor of the present disclosure and configured to drive the light control element.

<Other Members>

The other members are not particularly limited and may be appropriately selected depending on the intended purpose. Because the display element includes the field-effect transistor of the present disclosure, long service life and high-speed operation can be realized.

(Image Display Device)

An image display device of the present disclosure includes at least a plurality of display elements, a plurality of wired lines, and a display control device. The image display device further includes other members according to the necessity.

The image display device is a device configured to display an image corresponding to image data.

<Display Elements>

The plurality of display elements are not particularly limited and may be appropriately selected depending on the intended purpose, so long as the plurality of display elements are the display elements of the present disclosure arranged in a form of matrix.

<Wired Lines>

The plurality of wired lines are not particularly limited and may be appropriately selected depending on the intended purpose, so long as the plurality of wired lines are wired lines configured to individually apply gate voltage to the field-effect transistors in the plurality of display elements.

<Display Control Device>

The display control device is not particularly limited and may be appropriately selected depending on the intended purpose, so long as the display control device is a device configured to individually control the gate voltage of the field-effect transistors via the plurality of wired lines correspondingly to the image data.

<Other Members>

The other members are not particularly limited and may be appropriately selected depending on the intended purpose.

Because the image display device includes the display elements of the present disclosure, long service life and high-speed operation can be realized.

The image display device can be used as a display unit in mobile information devices (e.g., mobile phones, portable music players, portable video players, electronic books, and personal digital assistants (PDAs)) and camera devices (e.g., still cameras and video cameras). Moreover, the image display device can be used as a unit configured to display various pieces of information in transportation systems (e.g., cars, aircraft, trains, and ships). Furthermore, the image display device can be used as a unit configured to display various pieces of information in measuring devices, analysis devices, medical equipment, and advertising media.

(System)

A system of the present disclosure includes at least the image display device of the present disclosure and an image-data-generating device.

The image-data-generating device is a device configured to generate image data based on image information to be displayed and to output the image data to the image display device.

The display element, the image display device, and the system of the present disclosure will next be described with reference to the drawings.

First, a television device will be described as one example of the system of the present disclosure.

For example, the television device as one example of the system of the present disclosure can have the structure described in the paragraphs to [0058] and FIG. 1 in Japanese Unexamined Patent Application Publication No. 2010-074148.

Next, the image display device of the present disclosure will be described.

Figure 2:
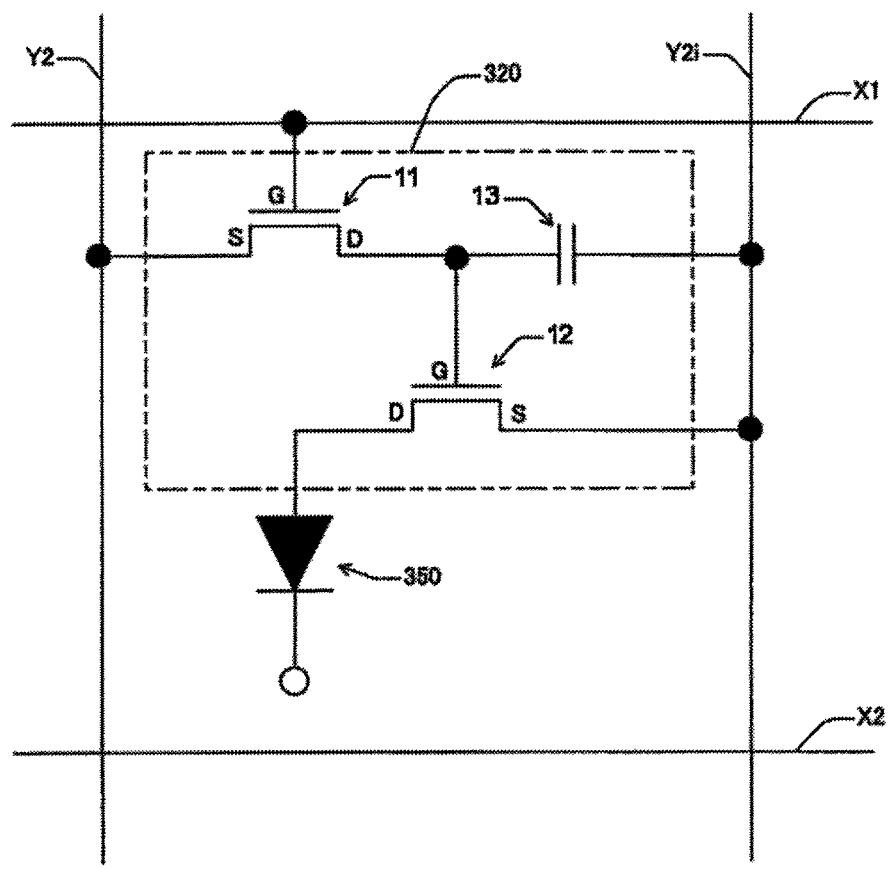
FIG. 2 is a diagram for explaining one example of a display element of the present disclosure.

For example, the image display device of the present disclosure can have the structure described in the paragraphs [0059] and [0060] and FIGS. 2 and 3 in Japanese Unexamined Patent Application Publication No. 2010-074148.

Next, the display element of the present disclosure will be described with reference to the drawings.

FIG. 1 illustrates a display 310 in which display elements are arranged in a form of matrix.

As illustrated in FIG. 1, the display 310 contains "n" scanning lines (X0, X1, X2, X3, . . . Xn-2, Xn-1) arranged along the X axis direction at constant intervals, "m" data lines (Y0, Y1, Y2, Y3, . . . Ym-1) arranged along the Y axis direction at constant intervals, and "m" current supply lines (Y0$i$, Y1$i$, Y2$i$, Y3$i$, Ym-1$i$) arranged along the Y axis direction at constant intervals.

Each of the display elements can be identified by each of the scanning lines and each of the data lines.

FIG. 2 is a schematic diagram illustrating one example of the display element of the present disclosure.

As illustrated as one example in FIG. 2, the display element contains an organic electroluminescent (EL) element 350 and a drive circuit 320 configured to emit light from the organic EL element 350. Specifically, the display 310 is an organic EL display of a so-called active matrix system. The display 310 is a 32-inch color display. Note that, a size of the display is not limited to this size.

The drive circuit 320 of FIG. 2 will be described.

The drive circuit 320 contains two field-effect transistors 11 and 12 and a capacitor 13. The field-effect transistor 11 operates as a switching element. A gate electrode G is coupled to a predetermined scanning line and a source electrode S is coupled to a predetermined data line. Moreover, a drain electrode D is coupled to one terminal of the capacitor 13.

The capacitor 13 is configured to memorize the state of the field-effect transistor 11; i.e., data. The other terminal of the capacitor 13 is coupled to a predetermined current supply line.

The field-effect transistor 12 is configured to supply large electric current to the organic EL element 350. A gate electrode G is coupled to a drain electrode D of the field-effect transistor 11. A drain electrode D is coupled to an anode of the organic EL element 350 and a source electrode S is coupled to a predetermined current supply line.

When the field-effect transistor 11 turns into the state of "On", the organic EL element 350 is driven by the field-effect transistor 12.

As illustrated as one example in FIG. 3A, the field-effect transistors 11 and 12 each contain a substrate 21, a gate electrode 22, a gate insulating layer 23, a source electrode 24, a drain electrode 25, and an oxide semiconductor layer 26.

The field-effect transistors 11 and 12 can be formed with the materials and by the processes mentioned in the descriptions of the field-effect transistor of the present disclosure.

Figure 4:
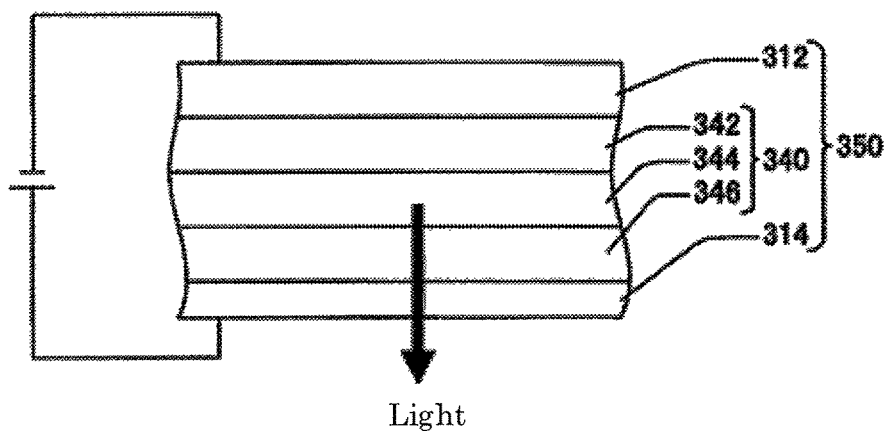
FIG. 4 is a schematic structural view illustrating one example of an organic EL element.

FIG. 4 is a schematic structural view illustrating one example of an organic EL element.

In FIG. 4, the organic EL element 350 contains a cathode 312, an anode 314, and an organic EL thin film layer 340.

A material of the cathode 312 is not particularly limited and may be appropriately selected depending on the intended purpose. Examples of the material include aluminium (Al), magnesium (Mg)-silver (Ag) alloy, aluminium (AD-lithium (Li) alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In FIG. 4, light is taken out from the side of the anode, but light can be taken out from the side of the cathode by making the cathode as a transparent or semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in the case where a silver alloy is used, the resultant electrode becomes a high-reflective electrode, which is suitable for taking light out from the side of the cathode.

The organic EL thin film layer 340 contains an electron transporting layer 342, a light emitting layer 344, and a hole transporting layer 346. The electron transporting layer 342 is coupled to a cathode 312, and the hole transporting layer 346 is coupled to an anode 314. The light emitting layer 344 emits light, when a predetermined voltage is applied between the anode 314 and the cathode 312.

Here, the electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described light control element in FIG. 4 is a so-called "bottom emission" organic EL element, in which light is taken out from the side of the substrate. However, the light control element may be a "top emission" organic EL element, in which light is taken out from the opposite side to the substrate.

Figure 5A:
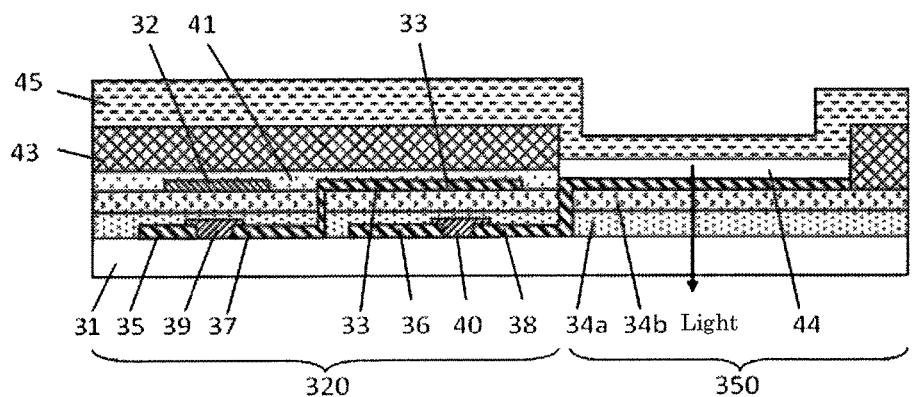
FIG. 5A is a schematic structural view illustrating one example of a display element of the present disclosure.
Figure 5B:
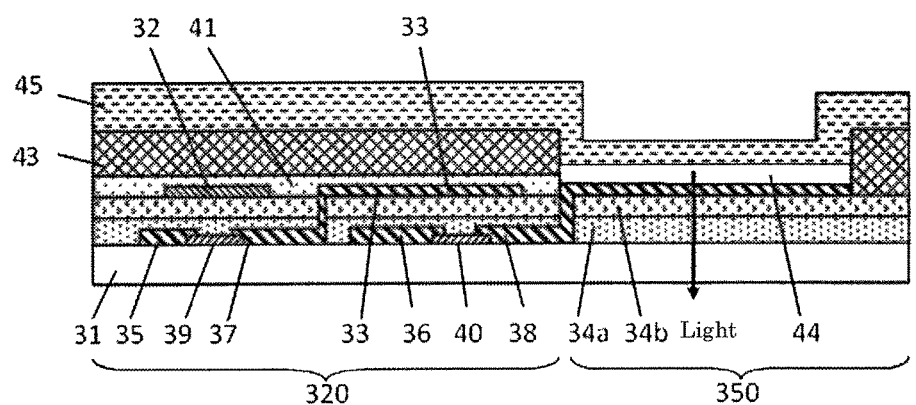
FIG. 5B is a schematic structural view illustrating one example of a display element of the present disclosure.
Figure 5C:
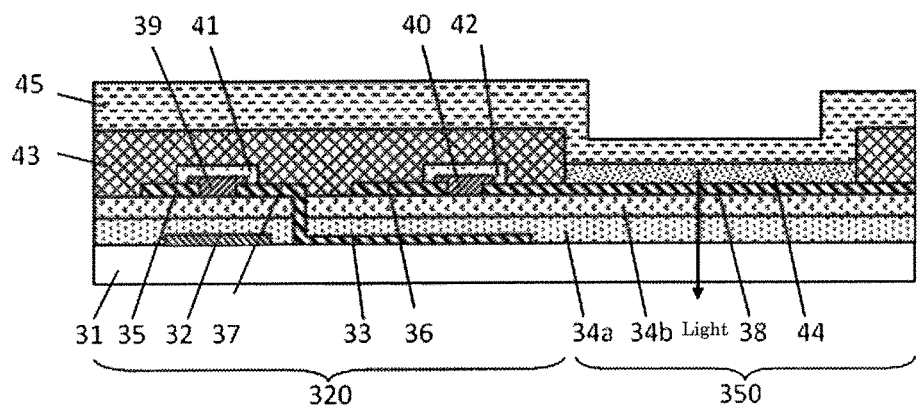
FIG. 5C is a schematic structural view illustrating one example of a display element of the present disclosure.
Figure 5D:
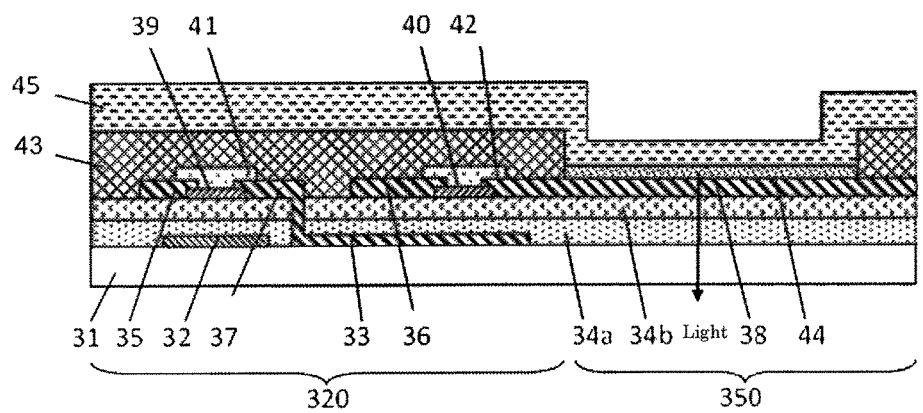
FIG. 5D is a schematic structural view illustrating one example of a display element of the present disclosure.
Figure 5E:
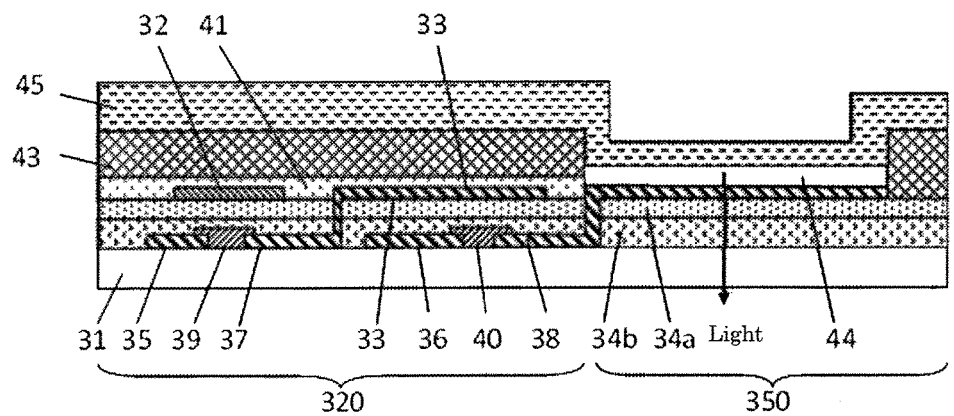
FIG. 5E is a schematic structural view illustrating one example of a display element of the present disclosure.
Figure 5F:
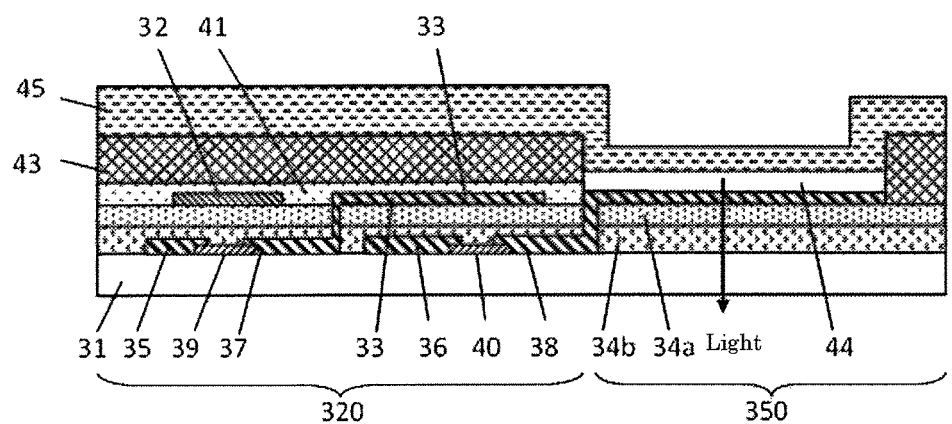
FIG. 5F is a schematic structural view illustrating one example of a display element of the present disclosure.
Figure 5G:
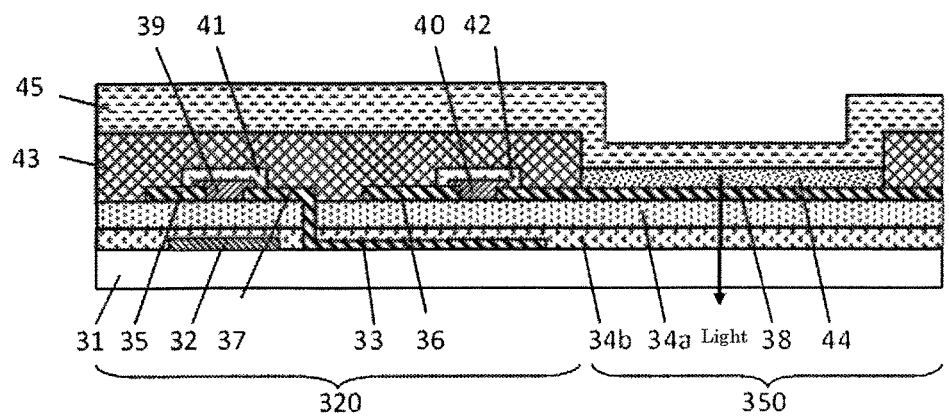
FIG. 5G is a schematic structural view illustrating one example of a display element of the present disclosure.
Figure 5H:
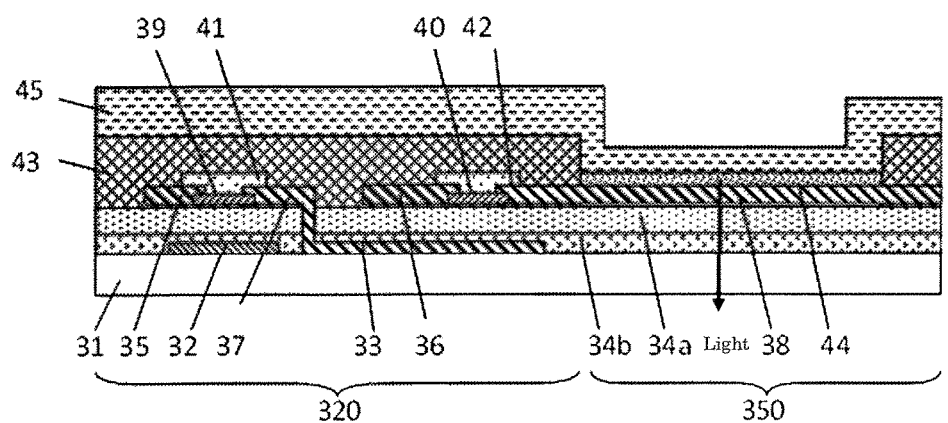
FIG. 5H is a schematic structural view illustrating one example of a display element of the present disclosure.

FIGS. 5A to 5H each illustrate one example of a display element combining an organic EL element 350 and a drive circuit 320. FIGS. 5A and 5E each illustrate a display element containing a bottom contact/top gate field-effect transistor. FIGS. 5B and 5F each illustrate a display element containing a top contact/top gate field-effect transistor. FIGS. 5C and 5G each illustrate a display element containing a bottom contact/bottom gate field-effect transistor. FIGS. 5D and 5H each illustrate a display element containing a top contact/bottom gate field-effect transistor.

The display element contains a substrate 31, first and second gate electrodes 32 and 33, a first gate insulating layer 34a, a second gate insulating layer 34b, first and second source electrodes 35 and 36, first and second drain electrodes 37 and 38, first and second oxide semiconductor layers 39 and 40, first and second passivation layers 41 and 42, and an interlayer insulating layer 43, an organic EL layer 44, and a cathode 45. The first drain electrode 37 and the second gate electrode 33 are coupled to each other via a through-hole formed in the first gate insulating layer 34a and the second gate insulating layer 34b.

For the sake of convenience, FIG. 5A is drawn as if the capacitor was formed between the second gate electrode 33 and the second drain electrode 38. In actual, the position of the capacitor formed is not limited and a capacitor having a necessary capacity can be appropriately designed at a necessary position.

In the display element of FIG. 5A, the second drain electrode 18 functions as an anode of the organic EL element 350.

The substrate 31, the first and second gate electrodes 32 and 33, the first gate insulating layer 34a, the second gate insulating layer 34b, the first and second source electrodes 35 and 36, the first and second drain electrodes 37 and 38, and the first and second oxide semiconductor layers 39 and 40 can be formed with the materials and by the processes mentioned in the descriptions of the field-effect transistor of the present disclosure.

Note that, the first gate insulating layer 34a corresponds to first gate insulating layer of the field-effect transistor of the present disclosure. The second gate insulating layer 34b corresponds to the second gate insulating layer of the field-effect transistor of the present disclosure.

A material of the interlayer insulating layer 43 (planarization layer) is not particularly limited and may be appropriately selected depending on the intended purpose. Examples of the material include organic materials, inorganic materials, and organic-inorganic composite materials.

Examples of the organic materials include: resins, such as polyimide, acrylic resins, fluororesins, non-fluororesins, olefin resins, and silicone resins; and photosensitive resins using these resins.

Examples of the inorganic materials include spin-on-glass (SOG) materials, such as AQUAMICA, available from AZ Electronic Materials.

Examples of the organic-inorganic composite materials include the organic-inorganic composite compounds containing a silane compound disclosed in Japanese Unexamined Patent Application Publication No. 2007-158146.

The interlayer insulating layer preferably has barrier properties against moisture, oxygen, and hydrogen contained in the atmosphere. A formation process of the interlayer insulating layer is not particularly limited and may be appropriately selected depending on the intended purpose. Examples of the formation process include: a method of directly forming a film having a desired shape through spin coating, inkjet printing, slit coating, nozzle printing, gravure printing, or dip coating; and a method of patterning a photosensitive material through photolithography.

It is effective to perform a heat treatment as a post treatment after the formation of the interlayer insulating layer to stabilize characteristics of the field-effect transistor constituting the display element.

Production methods of the organic EL layer 44 and the cathode 45 are not particularly limited and may be appropriately selected depending on the intended purpose. Examples oOf the production methods include: vacuum film forming methods (e.g., vacuum deposition and sputtering); and solution processes (e.g., inkjet printing and nozzle coating).

With these methods, it is possible to produce a display element which is a so-called "bottom emission" organic EL element where emitted light is taken out from the side of the substrate. In this case, the substrate 31, the gate insulating layer 34, and the second drain electrode (anode) 38 are required to be transparent.

In FIGS. 5A to 5H, the structure where the organic EL element 350 is disposed next to the drive circuit 320 has been described.

Figure 6A:
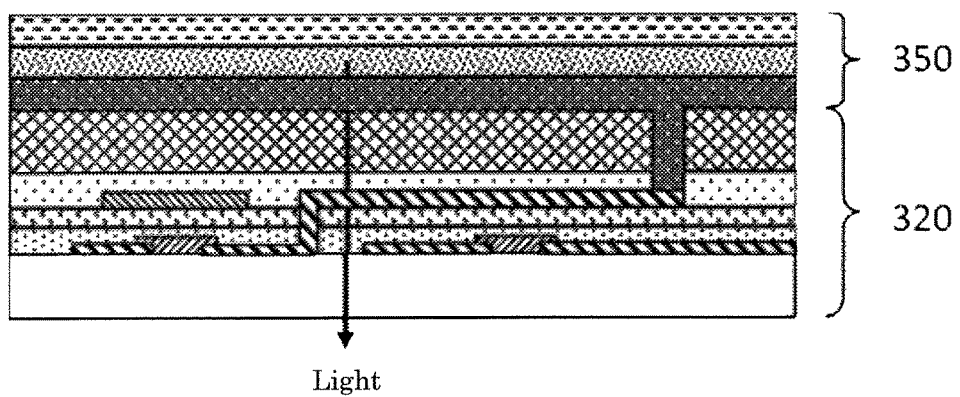
FIG. 6A is a schematic structural view illustrating another example of a display element of the present disclosure.
Figure 6B:
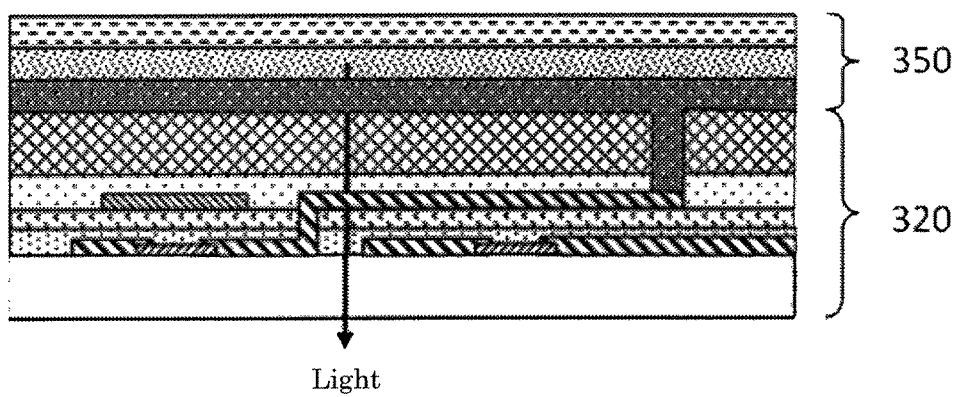
FIG. 6B is a schematic structural view illustrating another example of a display element of the present disclosure.
Figure 6C:
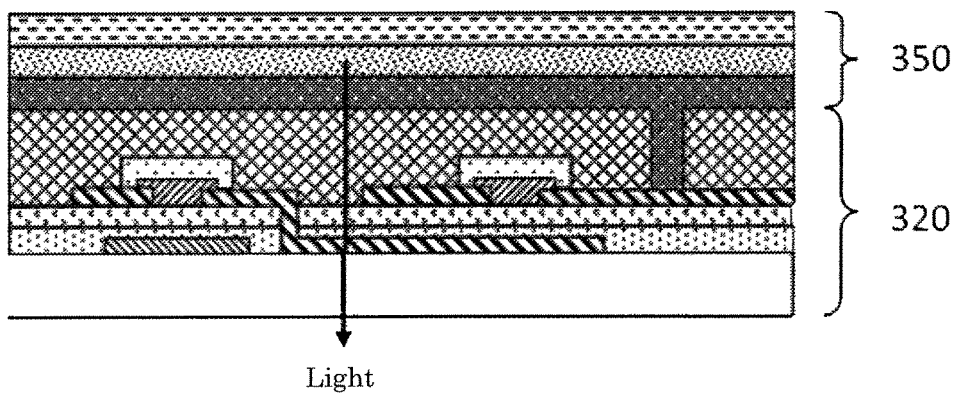
FIG. 6C is a schematic structural view illustrating another example of a display element of the present disclosure.
Figure 6D:
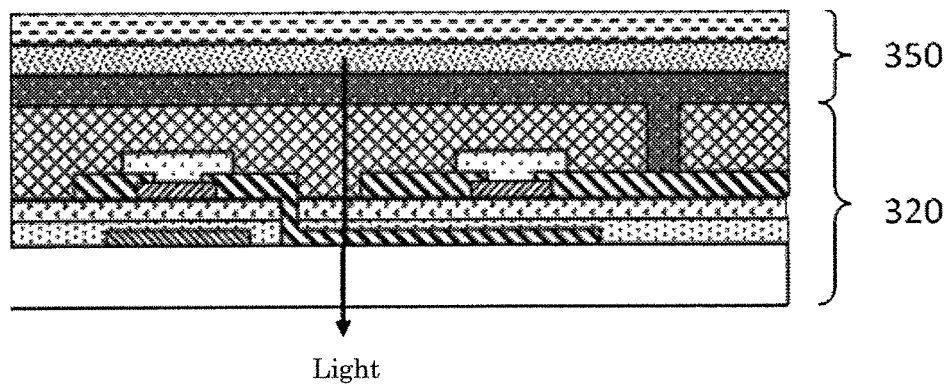
FIG. 6D is a schematic structural view illustrating another example of a display element of the present disclosure.

However, as illustrated in FIGS. 6A to 6D, the structure of the display element may be a structure where the organic EL element 350 is disposed above the drive circuit 320. FIG. 6A illustrates a display element containing a bottom contact/top gate field-effect transistor. FIG. 6B illustrates a display element containing a top contact/top gate field-effect transistor. FIG. 6C illustrates a display element containing a bottom contact/bottom gate field-effect transistor. FIG. 6D illustrates a display element containing a top contact/bottom gate field-effect transistor. Also in these cases, the organic EL element is a so-called "bottom emission" organic EL element where emitted light is taken out from the side of the substrate, and therefore the drive circuit 320 is required to be transparent. As for the source electrode and the drain electrode or the anode, preferably used are conductive transparent oxides, such as ITO, $In_2O_3$, $SnO_2$, ZnO, Ga-doped ZnO, Al-doped ZnO, and Sb-doped $SnO_2$.

Figure 7:
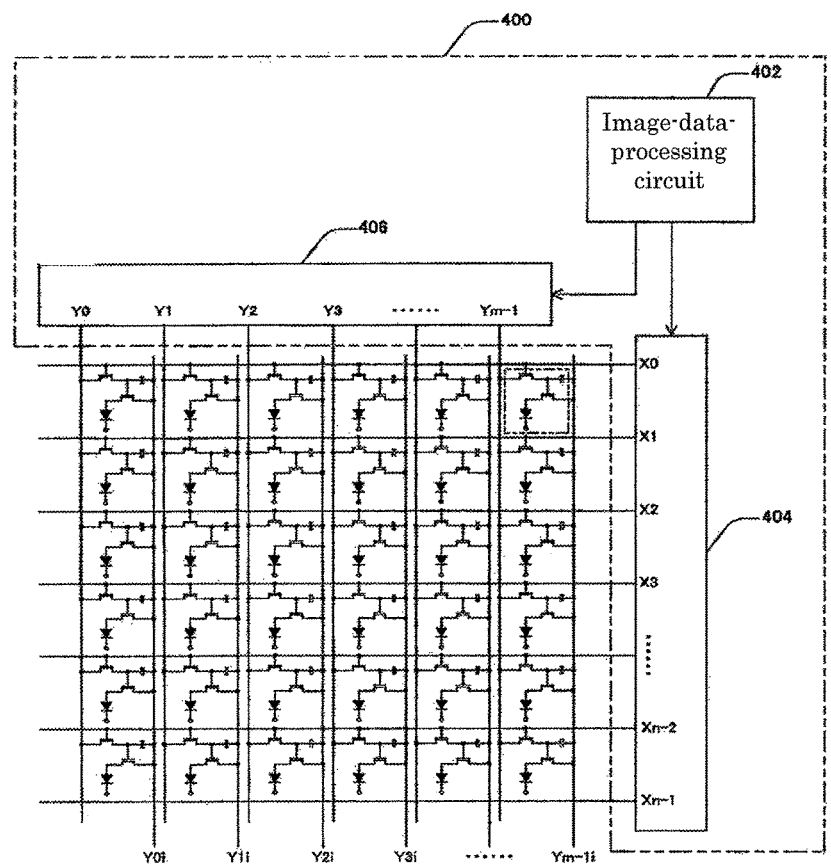
FIG. 7 is a diagram for explaining a display control device.

As illustrated as one example in FIG. 7, the display control device 400 contains an image-data-processing circuit 402, a scanning-line-driving circuit 404, and a data-line-driving circuit 406.

The image-data-processing circuit 402 determines brightness of a plurality of display elements 302 in the display 310 based on output signals of the image output circuit.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

Note that, the above embodiment refers to a case where the organic EL thin film layer contains an electron transporting layer, a light emitting layer, and a hole transporting layer, but this embodiment is not limitative. For example, an electron transporting layer and a light emitting layer may be combined as a single layer. Moreover, an electron injecting layer may be disposed between the electron transporting layer and the cathode. Furthermore, a hole injecting layer may be disposed between the hole transporting layer and the anode.

The above embodiment refers to a so-called "bottom emission" organic EL element where emitted light is taken out from the side of the substrate, but this embodiment is not limitative. For example, light may be taken out from the opposite side of the substrate by using a high-reflective electrode (e.g., a silver (Ag)-neodymium (Nd) alloy electrode) as the anode 314 and using a semi-transparent electrode (e.g., a magnesium (Mg)-silver (Ag) alloy electrode) or a transparent electrode (e.g., an ITO electrode) as the cathode 312.

The above embodiment refers to a case where the light control element is an organic EL element, but this embodiment is not limitative. For example, the light control element may be an electrochromic element. In this case, the display 310 is an electrochromic display.

Figure 8:
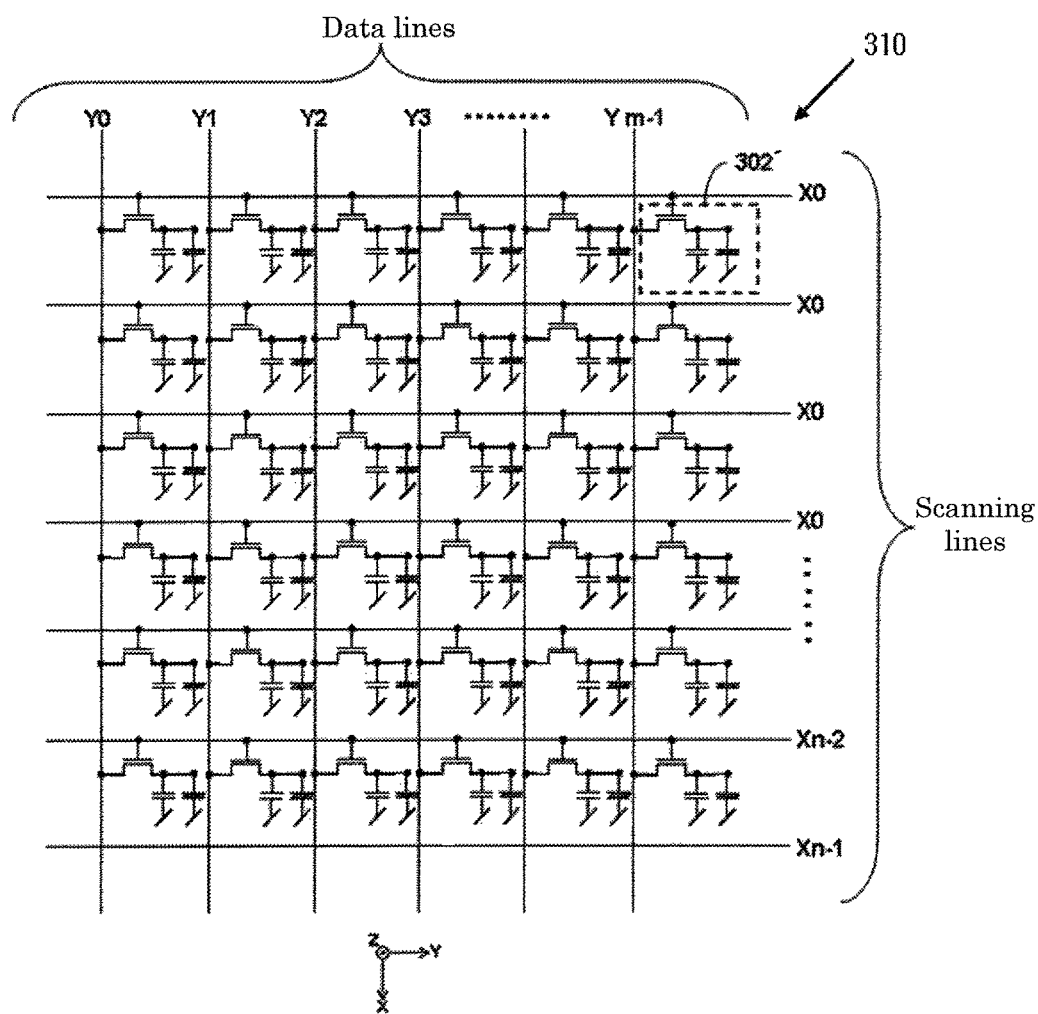
FIG. 8 is a diagram for explaining a liquid crystal display.

The light control element may be a liquid crystal element. In this case, the display 310 is a liquid crystal display. As illustrated as one example in FIG. 8, it is not necessary to provide a current supply line for a display element 302'.

Figure 9:
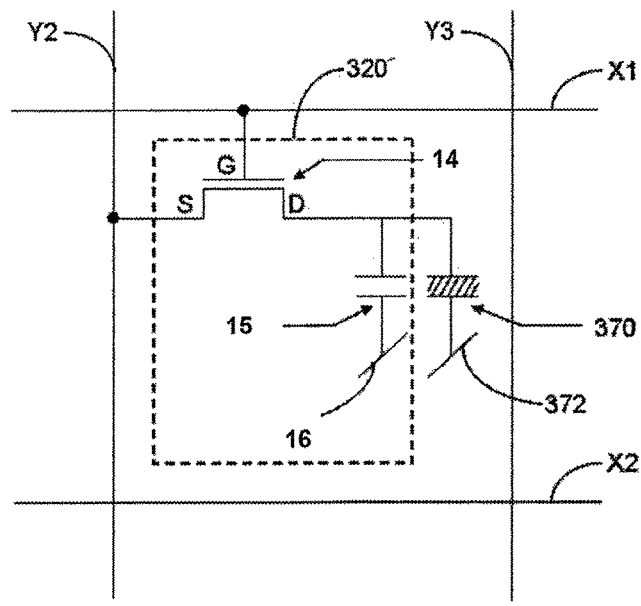
FIG. 9 is a diagram for explaining a display element in FIG. 8.

Alternatively, as illustrated as one example in FIG. 9, a drive circuit 320' may be produced with one field-effect transistor 14, which is similar to each of the field-effect transistors (11 and 12), and a capacitor 15. In the field-effect transistor 14, a gate electrode G is coupled to a predetermined scanning line and a source electrode S is coupled to a predetermined data line. Moreover, a drain electrode D is coupled to a pixel electrode of a liquid crystal element 370 and the capacitor 15. Note that, in FIG. 9, referential numerals 16 and 372 each denote a counter electrode (common electrode) of the liquid crystal element 370.

In the above embodiment, the light control element may be an electrophoretic element. Moreover, the light control element may be an electrowetting element.

The above embodiment refers to a case where the display is a color display, but this embodiment is not limitative.

Note that, the field-effect transistor according to the present embodiment can also be used for products other than the display elements (e.g., IC cards and ID tags).

The display element, the image display device, and the system each using the field-effect transistor of the present disclosure achieve high-speed operations and a long service life.

EXAMPLES

The present disclosure will next be described by way of Examples, but the Examples should not be construed to limit the present disclosure in any way. In the Examples below, the unit "%" denotes "% by mass", unless otherwise specified.

Example 1

<Production of Field-Effect Transistor>
—Preparation of First-Gate-Insulating-Layer-Coating Liquid—

In 1 mL of toluene, 0.16 mL of HMDS (1,1,1,3,3,3-hexamethyldisilazane, available from TOKYO OHKA KOGYO CO., LTD.) and 0.27 mL of a toluene solution of magnesium 2-ethylhexanoate (Mg content: 3%, Strem 12-1260, available from Strem Chemicals Inc.) were mixed, to obtain a first-gate-insulating-layer-coating liquid. A first oxide formed with the first-gate-insulating-layer-coating liquid would have the composition as presented in Table 1-1.

—Preparation of Second-Gate-Insulating-Layer-Coating Liquid—

In 1.2 mL of cyclohexylbenzene, 0.55 g of scandium(III) tris(2,2,6,6-tetramethyl-3,5-heptanedionate)hydrate (SIGMA-ALDRICH 517607, available from SIGMA-ALDRICH CO., LLC.) and 0.18 mL of a 2-ethylhexanoic acid solution of calcium 2-ethylhexanoate (Ca content: from 3% through 8%, Alfa36657, available from Alfa Aesar) were mixed, to obtain a second-gate-insulating-layer-coating liquid. A paraelectric amorphous oxide formed with the second-gate-insulating-layer-coating liquid would have the composition as presented in Table 1-1.

Next, a bottom contact/bottom gate field-effect transistor as illustrated in FIG. 3C was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of First Gate Insulating Layer—

Next, 0.6 mL of the first-gate-insulating-layer-coating liquid was dropped and spin-coated on the substrate under predetermined conditions (rotation was performed at 500 rpm for 5 seconds and; hen at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of Source Electrode and Drain Electrode—

Next, a source electrode 24 and a drain electrode 25 were formed on the second gate insulating layer 23b. Specifically, a Ti (titanium) film was formed on the second gate insulating layer 23b by DC sputtering so as to have an average film thickness of about 100 nm. Thereafter, a photoresist was coated on the Ti film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Ti film were removed by etching. Thereafter, the resist pattern was also removed to form the source electrode 24 and the drain electrode 25, each of which was formed of the Ti film.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25, to complete a field-effect transistor.

Example 2

<Production of Field-Effect Transistor>

—Preparation of First-Gate-Insulating-Layer-Coating Liquid—

In 1 mL of toluene, 0.13 mL of HMDS (1,1,1,3,3,3-hexamethyldisilazane, available from TOKYO OHKA KOGYO CO., LTD.), 0.16 mL of a 2-ethylhexanoic acid solution of calcium 2-ethylhexanoate (Ca content: from 3% through 8%, Alfa36657, available from Alfa Aesar), and 1.92 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-1.

—Preparation of Second-Gate-Insulating-Layer-Coating Liquid—

In 1.2 mL of cyclohexylbenzene, 0.23 g of samarium acetylacetonate trihydrate (Strem 93-6226, available from Strem Chemicals Inc.), 0.35 mL of a toluene solution of gadolinium 2-ethylhexanoate (Gd content: 25%, Strem 64-3500, available from Strem Chemicals Inc.), and 0.16 mL of a toluene solution of barium 2-ethylhexanoate (Ba content: 8%, Wako 021-09471, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-1.

Next, a top contact/bottom gate field-effect transistor as illustrated in FIG. 3H was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film —Formation of Second Gate Insulating Layer—

Next, 0.6 mL of the second-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the first gate insulating layer 23a and the oxide semiconductor layer. Specifically, an Al (aluminium) alloy film was formed on the first gate insulating layer 23a by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film. As a result, the source electrode 24 and the drain electrode 25 were formed on the oxide semiconductor layer 26 in an arrangement that a channel was formed, to complete a field-effect transistor.

Example 3

<Production of Field-Effect Transistor>
—Preparation of First-Gate-Insulating-Layer-Coating Liquid—

In 1 mL of toluene, 0.14 mL of HMDS (1,1,1,3,3,3-hexamethyldisilazane, available from TOKYO OHKA KOGYO CO., LTD.) and 0.86 mL of a toluene solution of barium 2-ethylhexanoate (Ba content: 8%, Wako 021-09471, available from Wako Chemical, Ltd.) were mixed, to obtain a first-gate-insulating-layer-coating liquid. A first oxide formed with the first-gate-insulating-layer-coating liquid would have the composition as presented in Table 1-1.
—Preparation of Second-Gate-Insulating-Layer-Coating Liquid—

In 1.2 mL of cyclohexylbenzene, 0.55 g of europium 2-ethylhexanoate (Strem 93-6311, available from Strem Chemicals Inc.) and 0.17 mL of a toluene solution of magnesium 2-ethylhexanoate (Mg content: 3%, Strem 12-1260, available from Strem Chemicals Inc.) were mixed, to obtain a second-gate-insulating-layer-coating liquid. A paraelectric amorphous oxide formed with the second-gate-insulating-layer-coating liquid would have the composition as presented in Table 1-1.

Next, a bottom contact/top gate field-effect transistor as illustrated in FIG. 3A was produced.
—Formation of Source Electrode and Drain Electrode—

First, a source electrode 24 and a drain electrode 25 were formed on a glass substrate (substrate 21). Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.
—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25.
—Formation of First Gate Insulating Layer—

Next, 0.6 mL of the first-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.
—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.
—Formation of Gate Electrode—

Next, a gate electrode 22 was formed on the second gate insulating layer. Specifically, an Au (gold) film was formed on the second gate insulating layer by DC sputtering so as to have an average film thickness of about 100 nm. Thereafter, a photoresist was coated on the Au film, and the resultant was subjected to prebake, exposure by an exposing device, and developing, to form a resist pattern having the same pattern as a pattern of the gate electrode 22 to be formed. Moreover, resist-pattern-free regions of the Au film were removed by etching.

Thereafter, the resist pattern was also removed to form the gate electrode 22 formed of the Au film, to complete a field-effect transistor.

Example 4

<Production of Field-Effect Transistor>
—Preparation of First-Gate-Insulating-Layer-Coating Liquid—

In 1 mL of toluene, 0.13 mL of HMDS (1,1,1,3,3,3-hexamethyldisilazane, available from TOKYO OHKA KOGYO CO., LTD.) and 3.1 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-1.
—Preparation of Second-Gate-Insulating-Layer-Coating Liquid—

In 1.2 mL of cyclohexylbenzene, 2.14 mL of a toluene solution of lanthanum 2-ethylhexanoate (La content: 7%, Wako 122-03371, available from Wako Chemical, Ltd.) and 0.70 mL of a toluene solution of strontium 2-ethylhexanoate (Sr content: 2%, Wako 195-09561, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-1.

Next, a top contact/top gate field-effect transistor as illustrated in FIG. 3F was produced.
—Formation of Oxide Semiconductor Layer—

First, an oxide semiconductor layer 26 was formed on a glass substrate (substrate 21). Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the substrate and the oxide semiconductor layer. Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching.

Thereafter, the resist pattern was also removed to form the source electrode 24 and the drain electrode 25, each of which was formed of the Al alloy film.

—Formation of Second Gate Insulating Layer—

Next, 0.6 mL of the second-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Gate Electrode—

Next, a gate electrode 22 was formed on the first gate insulating layer. Specifically, a Mo (molybdenum) film was formed on the first gate insulating layer by DC sputtering so as to have an average film thickness of about 100 nm. Thereafter, a photoresist was coated on the Mo film, and the resultant was subjected to prebake, exposure by an exposing device, and developing, to form a resist pattern having the same pattern as a pattern of the gate electrode 22 to be formed. Moreover, resist-pattern-free regions of the Mo film were removed by etching. Thereafter, the resist pattern was also removed to form the gate electrode 22 formed of the Mo film, to complete a field-effect transistor.

Example 5

<Production of Field-Effect Transistor>

—Preparation of First-Gate-Insulating-Layer-Coating Liquid—

In 1 mL of toluene, 0.12 mL of HMDS (1,1,1,3,3,3-hexamethyldisilazane, available from TOKYO OHKA KOGYO CO., LTD.), 0.10 mL of aluminum di(s-butoxide) acetoacetate chelate (Al content: 8.4%, Alfa89349, available from Alfa Aesar), and 0.55 mL of a toluene solution of barium 2-ethylhexanoate (Ba content: 8%, Wako 021-09471, available from Wako Chemical, Ltd.) were mixed, to obtain a first-gate-insulating-layer-coating liquid. A first oxide formed with the first-gate-insulating-layer-coating liquid would have the composition as presented in Table 1-2.

—Preparation of Second-Gate-Insulating-Layer-Coating Liquid—

In 1.2 mL of cyclohexylbenzene, 1.09 mL of a 2-ethylhexanoic acid solution of neodymium 2-ethylhexanoate (Nd content: 12%, Strem 60-2400, available from Strem Chemicals Inc.) and 1.18 mL of a toluene solution of strontium 2-ethylhexanoate (Sr content: 2%, Wako 195-09561, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-2.

Next, a top contact/bottom gate field-effect transistor as illustrated in FIG. 3D was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of First Gate Insulating Layer—

Next, 0.6 mL of the first-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the second gate insulating layer 23b and the oxide semiconductor layer. Specifically, an Au (gold) film was formed on the second gate insulating layer 23b by DC sputtering so as to have an average film thickness of about 100 nm. Thereafter, a photoresist was coated on the Au film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Au film were removed by etching. Thereafter, the resist pattern was also removed to form the source electrode 24 and the drain electrode 25, each of which was formed of the Au film As a result, the source electrode 24 and the drain electrode 25 were formed on the oxide semiconductor layer 26 in an arrangement that a channel was formed, to complete a field-effect transistor.

Example 6

<Production of Field-Effect Transistor>
—Preparation of First-Gate-Insulating-Layer-Coating Liquid—

In 1 mL of toluene, 0.15 mL of HMDS (1,1,1,3,3,3-hexamethyldisilazane, available from TOKYO OHKA KOGYO CO., LTD.), 0.05 g of (4,4,5,5-tetramethyl-1,3,2-dioxaborolan-2-yl)benzene (Wako 325-59912, available from Wako Chemical, Ltd.), 0.11 mL of a toluene solution of magnesium 2-ethylhexanoate (Mg content: 3%, Strem 12-1260, available from Strem Chemicals Inc.), and 0.15 mL of a toluene solution of barium 2-ethylhexanoate (Ba content: 8%, Wako 021-09471, available from Wako Chemical, Ltd.) were mixed, to obtain a first-gate-insulating-layer-coating liquid. A first oxide formed with the first-gate-insulating-layer-coating liquid would have the composition as presented in Table 1-2.

—Preparation of Second-Gate-Insulating-Layer-Coating Liquid—

In 1.2 mL of cyclohexylbenzene, 0.52 g of yttrium 2-ethylhexanoate (Strem 39-2400, available from Strem Chemicals Inc.), 0.10 mL of a toluene solution of magnesium 2-ethylhexanoate (Mg content: 3%, Strem 12-1260, available from Strem Chemicals Inc.), and 0.16 mL of a toluene solution of strontium 2-ethylhexanoate (Sr content: 2%, Wako 195-09561, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-2.

Next, a bottom contact/bottom gate field-effect transistor as illustrated in FIG. 3G was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of Second Gate Insulating Layer—

Next, 0.6 mL of the second-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Source Electrode and Drain Electrode—

Next, a source electrode 24 and a drain electrode 25 were formed on the first gate insulating layer 23a. Specifically, a Mo (molybdenum) film was formed on the first gate insulating layer 23a by DC sputtering so as to have an average film thickness of about 100 nm. Thereafter, a photoresist was coated on the Mo film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Mo film were removed by etching. Thereafter, the resist pattern was also removed to form the source electrode 24 and the drain electrode 25, each of which was formed of the Mo film.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25, to complete a field-effect transistor.

Example 7

<Production of Field-Effect Transistor>
—Preparation of First-Gate-Insulating-Layer-Coating Liquid—

In 1 mL of toluene, 0.10 mL of HMDS (1,1,1,3,3,3-hexamethyldisilazane, available from TOKYO OHKA KOGYO CO., LTD.), 0.10 mL of aluminum di(s-butoxide) acetoacetate chelate (Al content: 8.4%, Alfa89349, available from Alfa Aesar), 0.04 g of (4,4,5,5-tetramethyl-1,3,2-dioxaborolan-2-yl)benzene (Wako 325-59912, available from Wako Chemical, Ltd.), and L9 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-2.

—Preparation of Second-Gate-Insulating-Layer-Coating Liquid—

In 1.2 mL of cyclohexylbenzene, 0.65 mL of a toluene solution of gadolinium 2-ethylhexanoate (Gd content: 25%, Strem 64-3500, available from Strem Chemicals Inc.) and 0.10 mL of a 2-ethylhexanoic acid solution of calcium 2-ethylhexanoate (Ca content: from 3% through 8%, Alfa36657, available from Alfa Aesar) were mixed, to obtain a second-gate-insulating-layer-coating liquid. A paraelectric amorphous oxide formed with the second-gate-insulating-layer-coating liquid would have the composition as presented in Table 1-2.

Next, a top contact/top gate field-effect transistor as illustrated in FIG. 3B was produced.

—Formation of Oxide Semiconductor Layer—

First, an oxide semiconductor layer 26 was formed on a glass substrate (substrate 21). Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the substrate and the oxide semiconductor layer. Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.

—Formation of First Gate Insulating Layer—

Next, 0.6 mL of the first-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of Gate Electrode—

Next, a gate electrode 22 was formed on the second gate insulating layer. Specifically, a Ti (titanium) film was formed on the second gate insulating layer by DC sputtering so as to have an average film thickness of about 100 nm. Thereafter, a photoresist was coated on the Ti film, and the resultant was subjected to prebake, exposure by an exposing device, and developing, to form a resist pattern having the same pattern as a pattern of the gate electrode 22 to be formed. Moreover, resist-pattern-free regions of the Ti film were removed by etching. Thereafter, the resist pattern was also removed to form the gate electrode 22 formed of the Ti film, to complete a field-effect transistor.

Example 8

<Production of Field-Effect Transistor>

—Preparation of First-Gate-Insulating-Layer-Coating Liquid—

In 1 mL of toluene, 0.14 mL of HMDS (1,1,1,3,3,3-hexamethyldisilazane, available from TOKYO OHKA KOGYO CO., LTD.), 0.07 mL of aluminum di(s-butoxide) acetoacetate chelate (Al content: 8.4%, Alfa89349, available from Alfa Aesar), 0.02 g of (4,4,5,5-tetramethyl-1,3,2-dioxaborolan-2-yl)benzene (Wako 325-59912, available from Wako Chemical, Ltd.), and 0.18 mL of a 2-ethylhexanoic acid solution of calcium 2-ethylhexanoate (Ca content: from 3% through 8%, Alfa36657, available from Alfa Aesar) were mixed, to obtain a first-gate-insulating-layer-coating liquid. A first oxide formed with the first-gate-insulating-layer-coating liquid would have the composition as presented in Table 1-2.

—Preparation of Second-Gate-Insulating-Layer-Coating Liquid—

In 1.2 mL of cyclohexylbenzene, 0.42 g of ytterbium acetylacetonate trihydrate (Strem 70-2202, available from Strem Chemicals Inc.) and 0.45 mL of a toluene solution of barium 2-ethylhexanoate (Ba content: 8%, Wako 021-09471, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-2.

Next, a bottom contact/top gate field-effect transistor as illustrated in FIG. 3E was produced.

—Formation of Source Electrode and Drain Electrode—

First, a source electrode 24 and a drain electrode 25 were formed on a glass substrate (substrate 21). Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25.

—Formation of Second Gate Insulating Layer—

Next, 0.6 mL of the second-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Gate Electrode—

Next, a gate electrode 22 was formed on the first gate insulating layer. Specifically, an ITO film was formed on the first gate insulating layer by DC sputtering so as to have an average film thickness of about 100 nm. Thereafter, a photoresist was coated on the ITO film, and the resultant was subjected to prebake, exposure by an exposing device, and developing, to form a resist pattern having the same pattern as a pattern of the gate electrode 22 to be formed. Moreover, resist-pattern-free regions of the ITO film were removed by etching. Thereafter, the resist pattern was also removed to form the gate electrode 22 formed of the ITO film, to complete a field-effect transistor.

Example 9

<Production of Field-Effect Transistor>

—Preparation of First-Gate-Insulating-Layer-Coating Liquid—

In 1 mL of toluene, 0.13 mL of HMDS (1,1,1,3,3,3-hexamethyldisilazane, available from TOKYO OHKA KOGYO CO., LTD.) and 0.52 mL of a toluene solution of magnesium 2-ethylhexanoate (Mg content: 3%, Strem 12-1260, available from Strem Chemicals Inc.) were mixed, to obtain a first-gate-insulating-layer-coating liquid. A first oxide formed with the first-gate-insulating-layer-coating liquid would have the composition as presented in Table 1-3.

—Preparation of Second-Gate-Insulating-Layer-Coating Liquid—

In 1.2 mL of cyclohexylbenzene, 0.61 g of europium 2-ethylhexanoate (Strem 93-6311, available from Strem Chemicals Inc.), 0.05 mL of a 2-ethylhexanoic acid solution of calcium 2-ethylhexanoate (Ca content: from 3% through 8%, Alfa36657, available from Alfa Aesar), and 0.03 mL of a mineral spirit solution of zirconium oxide 2-ethylhexanoate (Zr content: 12%, Wako 269-01116, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-3.

Next, a bottom contact/bottom gate field-effect transistor as illustrated in FIG. 3C was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of First Gate Insulating Layer—

Next, 0.6 mL of the first-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of Source Electrode and Drain Electrode—

Next, a source electrode 24 and a drain electrode 25 were formed on the second gate insulating layer 23b. Specifically, a Ti (titanium) film was formed on the second gate insulating layer 23b by DC sputtering so as to have an average film thickness of about 100 nm. Thereafter, a photoresist was coated on the Ti film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Ti film were removed by etching. Thereafter, the resist pattern was also removed to form the source electrode 24 and the drain electrode 25, each of which was formed of the Ti film.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25, to complete a field-effect transistor.

Example 10

<Production of Field-Effect Transistor>

—Preparation of First-Gate-Insulating-Layer-Coating Liquid—

In 1 mL of toluene, 0.15 mL of HMDS (1,1,1,3,3,3-hexamethyldisilazane, available from TOKYO OHKA KOGYO CO., LTD.) and 0.65 mL of a toluene solution of barium 2-ethylhexanoate (Ba content: 8%, Wako 021-09471, available from Wako Chemical, Ltd.) were mixed, to obtain a first-gate-insulating-layer-coating liquid. A first oxide formed with the first-gate-insulating-layer-coating liquid would have the composition as presented in Table 1-3.

—Preparation of Second-Gate-Insulating-Layer-Coating Liquid—

In 1.2 mL of cyclohexylbenzene, 0.24 g of samarium acetylacetonate trihydrate (Strem 93-6226, available from Strem Chemicals Inc.), 0.21 g of dysprosium acetylacetonate trihydrate (Strem 66-2002, available from Strem Chemicals Inc.), 0.48 mL of a toluene solution of strontium 2-ethylhexanoate (Sr content: 2%, Wako 195-09561, available from Wako Chemical, Ltd.), and 0.06 mL of a 2-ethylhexanoic acid solution of hafnium 2-ethylhexanoate (Gelest AKH332, available from Gelest, Inc.) were mixed, to obtain a second-gate-insulating-layer-coating liquid. A paraelectric amorphous oxide formed with the second-gate-insulating-layer-coating liquid would have the composition as presented in Table 1-3.

Next, a top contact/bottom gate field-effect transistor as illustrated in FIG. 3H was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of Second Gate Insulating Layer—

Next, 0.6 mL of the second-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the first gate insulating layer 23a and the oxide semiconductor layer. Specifically, an ITO film was formed on the first gate insulating layer 23a by DC sputtering so as to have an average film thickness of about 100 nm. Thereafter, a photoresist was coated on the ITO film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the ITO film were removed by etching. Thereafter, the resist pattern was also removed to form the source electrode 24 and the drain electrode 25, each of which was formed of the ITO film. As a result, the source electrode 24 and the drain electrode 25 were formed on the oxide semiconductor layer 26 in an arrangement that a channel was formed, to complete a field-effect transistor.

Example 11

<Production of Field-Effect Transistor>

—Preparation of First-Gate-Insulating-Layer-Coating Liquid—

In 1 mL of toluene, 0.16 mL of HMDS (1,1,1,3,3,3-hexamethyldisilazane, available from TOKYO OHKA KOGYO CO., LTD.) and 1.59 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-3.
—Preparation of Second-Gate-Insulating-Layer-Coating Liquid—

In 1.2 mL of cyclohexylbenzene, 2.02 mL of a toluene solution of lanthanum 2-ethylhexanoate (La content: 7%, Wako 122-03371, available from Wako Chemical, Ltd.), 0.13 mL of a toluene solution of magnesium 2-ethylhexanoate (Mg content: 3%, Strem 12-1260, available from Strem Chemicals Inc.), 0.01 mL of a mineral spirit solution of zirconium oxide 2-ethylhexanoate (Zr content: 12%, Wako 269-01116, available from Wako Chemical, Ltd.), and 0.03 mL of a 2-ethylhexanoic acid solution of hafnium 2-ethylhexanoate (Gelest AKH332, available from Gelest, Inc.) were mixed, to obtain a second-gate-insulating-layer-coating liquid. A paraelectric amorphous oxide formed with the second-gate-insulating-layer-coating liquid would have the composition as presented in Table 1-3.

Next, a bottom contact/top gate field-effect transistor as illustrated in FIG. 3A was produced.
—Formation of Source Electrode and Drain Electrode—

First, a source electrode 24 and a drain electrode 25 were formed on a glass substrate (substrate 21). Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.
—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25.
—Formation of First Gate Insulating Layer—

Next, 0.6 mL of the first-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.
—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.
—Formation of Gate Electrode—

Next, a gate electrode 22 was formed on the second gate insulating layer. Specifically, a Si (silicon) film was formed on the second gate insulating layer by DC sputtering so as to have an average film thickness of about 100 nm. Thereafter, a photoresist was coated on the Si film, and the resultant was subjected to prebake, exposure by an exposing device, and developing, to form a resist pattern having the same pattern as a pattern of the gate electrode 22 to be formed. Moreover, resist-pattern-free regions of the Si film were removed by etching. Thereafter, the resist pattern was also removed to form the gate electrode 22 formed of the Si film, to complete a field-effect transistor.

Example 12

<Production of Field-Effect Transistor>
—Preparation of First-Gate-Insulating-Layer-Coating Liquid—

In 1 mL of toluene, 0.16 mL of HMDS (1,1,1,3,3,3-hexamethyldisilazane, available from TOKYO OHKA KOGYO CO., LTD.), 0.15 mL of a 2-ethylhexanoic acid solution of calcium 2-ethylnexanoate (Ca content: from 3% through 8%, Alfa36657, available from Alfa Aesar), and 0.50 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-3.
—Preparation of Second-Gate-Insulating-Layer-Coating Liquid—

In 1.2 mL of cyclohexylbenzene, 0.43 g of scandium(III) tris(2,2,6,6-tetramethyl-3,5-heptanedionate)hydrate (SIGMA-ALDRICH 517607, available from SIGMA-ALDRICH CO., LLC.), 0.12 g of samarium acetylacetonate trihydrate (Strem 93-6226, available from Strem Chemicals Inc.), 0.14 mL of a toluene solution of barium 2-ethylhexanoate (Ba content: 8%, Wako 021-09471, available from Wako Chemical, Ltd.), and 0.06 mL of a mineral spirit solution of zirconium oxide 2-ethylhexanoate (Zr content: 12%, Wako 269-01116, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-3.

Next, a top contact/top gate field-effect transistor as illustrated in FIG. 3F was produced.
—Formation of Oxide Semiconductor Layer—

First, an oxide semiconductor layer 26 was formed on a glass substrate (substrate 21). Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the substrate and the oxide semiconductor layer. Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.

—Formation of Second Gate Insulating Layer—

Next, 0.6 mL of the second-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Gate Electrode—

Next, a gate electrode 22 was formed on the first gate insulating layer. Specifically, an Au (gold) film was formed on the first gate insulating layer by DC sputtering so as to have an average film thickness of about 100 nm. Thereafter, a photoresist was coated on the Au film, and the resultant was subjected to prebake, exposure by an exposing device, and developing, to form a resist pattern having the same pattern as a pattern of the gate electrode 22 to be formed. Moreover, resist-pattern-free regions of the Au film were removed by etching. Thereafter, the resist pattern was also removed to form the gate electrode 22 formed of the Au film, to complete a field-effect transistor.

Example 13

<Production of Field-Effect Transistor>

—Preparation of First-Gate-Insulating-Layer-Coating Liquid—

In 1 mL of toluene, 0.12 mL of HMDS (1,1,1,3,3,3-hexamethyldisilazane, available from TOKYO OHKA KOGYO CO., LTD.), 0.11 mL of aluminum di(s-butoxide) acetoacetate chelate (Al content: 8.4%, Alfa89349, available from Alfa Aesar), and 0.29 mL of a toluene solution of magnesium 2-ethylhexanoate (Mg content: 3%, Strem 12-1260, available from Strem Chemicals Inc.) were mixed, to obtain a first-gate-insulating-layer-coating liquid. A first oxide formed with the first-gate-insulating-layer-coating liquid would have the composition as presented in Table 1-4.

Preparation of Second-Gate-Insulating-Layer-Coating Liquid—

In 1.2 mL of cyclohexylbenzene, 0.47 g of ytterbium acetylacetonate trihydrate (Strem 70-2202, available from Strem Chemicals Inc.), 0.05 mL of a 2-ethylhexanoic acid solution of calcium 2-ethylhexanoate (Ca content: from 3% through 8%, Alfa36657, available from Alfa Aesar), 0.18 mL of a toluene solution of strontium 2-ethylhexanoate (Sr content: 2%, Wako 195-09561, available from Wako Chemical, Ltd.), and 0.04 mL of a mineral spirit solution of zirconium oxide 2-ethylhexanoate (Zr content: 12%, Wako 269-01116, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-4.

Next, a top contact/bottom gate field-effect transistor as illustrated in FIG. 3D was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of First Gate Insulating Layer—

Next, 0.6 mL of the first-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the second gate insulating layer 23b and the oxide semiconductor layer. Specifically, an Au (gold) film was formed on the second gate insulating layer 23b by DC sputtering so as to have an average film thickness of about 100 nm. Thereafter, a photoresist was coated on the Au film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Au film were removed by etching. Thereafter, the resist pattern was also removed to form the source electrode 24 and the drain electrode 25, each of which was formed of the Au film. As a result, the source electrode 24 and the drain electrode 25 were formed on the oxide semiconductor layer 26 in an arrangement that a channel was formed, to complete a field-effect transistor.

Example 14

<Production of Field-Effect Transistor>
—Preparation of First-Gate-Insulating-Layer-Coating Liquid—

In 1 mL of toluene, 0.11 mL of HMDS (1,1,1,3,3,3-hexamethyldisilazane, available from TOKYO OHKA KOGYO CO., LTD.), 0.10 g of (4,4,5,5-tetramethyl-1,3,2-dioxaborolan-2-yl)benzene (Wako 325-59912, available from Wako Chemical, Ltd.), 0.14 mL of a 2-ethylhexanoic acid solution of calcium 2-ethylhexanoate (Ca content: from 3% through 8%, Alfa36657, available from Alfa Aesar), and 0.43 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-4.

—Preparation of Second-Gate-Insulating-Layer-Coating Liquid—

In 1.2 mL of cyclohexylbenzene, 0.63 g of scandium(III) tris(2,2,6,6-tetramethyl-3,5-heptanedionate)hydrate (SIGMA-ALDRICH 517607, available from SIGMA-ALDRICH CO., LLC.), 0.05 mL of a 2-ethylhexanoic acid solution of calcium 2-ethylhexanoate (Ca content: from 3% through 8%, Alfa36657, available from Alfa Aesar), 0.02 mL of a mineral spirit solution of zirconium oxide 2-ethylhexanoate (Zr content: 12%, Wako 269-01116, available from Wako Chemical, Ltd.), and 0.01 mL of a 2-ethylhexanoic acid solution of hafnium 2-ethylhexanoate (Gelest AKH332, available from Gelest, Inc.) were mixed, to obtain a second-gate-insulating-layer-coating liquid. A paraelectric amorphous oxide formed with the second-gate-insulating-layer-coating liquid would have the composition as presented in Table 1-4.

Next, a bottom contact/bottom gate field-effect transistor as illustrated in FIG. 3G was produced.

—Formation of Gate Electrode—

First, a gate electrode 22 was formed on a glass substrate (substrate 21). Specifically, an Al (aluminium) alloy film was formed on the glass substrate (substrate 21) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 22 to be formed. Moreover, resist-pattern-free regions of the Al alloy film were removed by etching. Thereafter, the resist pattern was also removed to form the gate electrode 22 formed of the Al alloy film.

—Formation of Second Gate Insulating Layer—

Next, 0.6 mL of the second-gate-insulating-layer-coating liquid was dropped and spin-coated on the substrate under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a first-oxide film as a first gate insulating layer 23a. The average film thickness of the first gate insulating layer was about 25 nm.

—Formation of Source Electrode and Drain Electrode—

Next, a source electrode 24 and a drain electrode 25 were formed on the first gate insulating layer 23a. Specifically, an ITO film was formed on the first gate insulating layer 23a by DC sputtering so as to have an average film thickness of about 100 nm. Thereafter, a photoresist was coated on the ITO film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the ITO film were removed by etching. Thereafter, the resist pattern was also removed to form the source electrode 24 and the drain electrode 25, each of which was formed of the ITO film.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25, to complete a field-effect transistor.

Example 15

<Production of Field-Effect Transistor>
—Preparation of First-Gate-Insulating-Layer-Coating Liquid—

In 1 mL of toluene, 0.11 mL of HMDS (1,1,1,3,3,3-hexamethyldisilazane, available from TOKYO OHKA KOGYO CO., LTD.), 0.10 mL of aluminum di(s-butoxide) acetoacetate chelate (Al content: 8.4%, Alfa89349, available from Alfa Aesar), 0.07 mL of (4,4,5,5-tetramethyl-1,3,2-dioxaborolan-2-yl)benzene (Wako 325-59912; available from Wako Chemical, Ltd.), 0.09 mL of a 2-ethylhexanoic acid solution of calcium 2-ethylhexanoate (Ca content: from 3% through 8%, Alfa36657, available from Alfa Aesar), and 0.19 mL of a toluene solution of strontium 2-ethylhexanoate (Sr content: 2%, Wako 195-09561, available from Wako Chemical, Ltd.) were mixed, to obtain a first-gate-insulating-layer-coating liquid. A first oxide formed with the first-gate-insulating-layer-coating liquid would have the composition as presented in Table 1-4.

—Preparation of Second-Gate-Insulating-Layer-Coating Liquid—

In 1.2 mL of cyclohexylbenzene, 1.95 mL of a toluene solution of lanthanum 2-ethylhexanoate (La content: 7%, Wako 122-03371, available from Wako Chemical, Ltd.), 0.57 mL of a toluene solution of strontium 2-ethylhexanoate (Sr content: 2%, Wako 195-09561, available from Wako Chemical, Ltd.), and 0.09 mL of a mineral spirit solution of zirconium oxide 2-ethylhexanoate (Zr content: 12%, Wako 269-01116, available from Wako Chemical, Ltd.) were mixed, to obtain a second-gate-insulating-layer-coating liquid. A paraelectric amorphous oxide formed with the second-gate-insulating-layer-coating liquid would have the composition as presented in Table 1-4.

Next, a top contact/top gate field-effect transistor as illustrated in FIG. 3B was produced.

—Formation of Oxide Semiconductor Layer—

First, an oxide semiconductor layer 26 was formed on a glass substrate (substrate 21). Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26.

—Formation of Source Electrode and Drain Electrode—

Next, a source electrode 24 and a drain electrode 25 were formed on the substrate and the oxide semiconductor layer. Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.

—Formation of First Gate Insulating Layer—

Next, 0.6 mL of the first-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour and then baking in the $O_2$ atmosphere at 400° C. for 3 hours, to form a first-oxide film as a first gate insulating layer 23a. The average film thickness of the first gate insulating layer was about 25 nm.

—Formation of Second Gate Insulating Layer—

Next, 0.6 mL of the second-gate-insulating-layer-coating liquid was dropped and spin-coated on the first gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of Gate Electrode—

Next, a gate electrode 22 was formed on the second gate insulating layer. Specifically, an Au (gold) film was formed on the second gate insulating layer by DC sputtering so as to have an average film thickness of about 100 nm. Thereafter, a photoresist was coated on the Au film, and the resultant was subjected to prebake, exposure by an exposing device, and developing, to form a resist pattern having the same pattern as a pattern of the gate electrode 22 to be formed. Moreover, resist-pattern-free regions of the Au film were removed by etching. Thereafter, the resist pattern was also removed to form the gate electrode 22 formed of the Au film, to complete a field-effect transistor.

Example 16

<Production of Field-Effect Transistor>
—Preparation of First-Gate-Insulating-Layer-Coating Liquid—

In 1 mL of toluene, 0.13 mL of HMDS (1,1,1,3,3,3-hexamethyldisilazane, available from TOKYO OHKA KOGYO CO., LTD.), 0.07 mL of aluminum di(s-butoxide) acetoacetate chelate (Al content: 8.4%, Alfa89349, available from Alfa Aesar), and 0.71 mL of a toluene solution of barium 2-ethylhexanoate (Ba content: 8%, Wako 021-09471, available from Wako Chemical, Ltd.) were mixed, to obtain a first-gate-insulating-layer-coating liquid. A first oxide formed with the first-gate-insulating-layer-coating liquid would have the composition as presented in Table 1-4.

—Preparation of Second-Gate-Insulating-Layer-Coating Liquid—

In 1.2 mL of cyclohexylbenzene, 0.61 mL of a toluene solution of gadolinium 2-ethylhexanoate (Gd content: 25%, Strem 64-3500, available from Strem Chemicals Inc.), 0.12 mL of a toluene solution of magnesium 2-ethylhexanoate (Mg content: 3%, Strem 12-1260, available from Strem Chemicals Inc.), 0.03 mL of a mineral spirit solution of zirconium oxide 2-ethylhexanoate (Zr content: 12%, Wako 269-01116, available from Wako Chemical, Ltd.), and 0.01 mL of a 2-ethylhexanoic acid solution of hafnium 2-ethylhexanoate (Gelest AKH332, available from Gelest, Inc.)

were mixed, to obtain a second-gate-insulating-layer-coating liquid. A paraelectric amorphous oxide formed with the second-gate-insulating-layer-coating liquid would have the composition as presented in Table 1-4.

Next, a bottom contact/top gate field-effect transistor as illustrated in FIG. 3E was produced.

—Formation of Source Electrode and Drain Electrode—

First, a source electrode 24 and a drain electrode 25 were formed on a glass substrate (substrate 21). Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 24 and the drain electrode 25 to be formed. Moreover, resist-pattern-free regions of the Al alloy film were removed by etching. Thereafter, the resist pattern was also removed to form the source electrode 24 and the drain electrode 25, each of which was formed of the Al alloy film.

—Formation of Oxide Semiconductor Layer—

Next, an oxide semiconductor layer 26 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 26 to be formed. Moreover, resist-pattern-free regions of the Mg—In based oxide film were removed by etching. Thereafter, the resist pattern was also removed to form the oxide semiconductor layer 26. As a result, the oxide semiconductor layer 26 was formed in a manner that a channel was formed between the source electrode 24 and the drain electrode 25.

—Formation of Second Gate Insulating Layer—

Next, 0.6 mL of the second-gate-insulating-layer-coating liquid was dropped and spin-coated on the substrate, the oxide semiconductor layer, the source electrode, and the drain electrode under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a paraelectric amorphous oxide film as a second gate insulating layer 23b. The average film thickness of the second gate insulating layer was about 110 nm.

—Formation of First Gate Insulating Layer—

Next, 0.6 mL of the first-gate-insulating-layer-coating liquid was dropped and spin-coated on the second gate insulating layer under predetermined conditions (rotation was performed at 500 rpm for 5 seconds and then at 3,000 rpm for 20 seconds, and the rotation was stopped so as to be 0 rpm in 5 seconds). Subsequently, the resultant was subjected to an evaporation treatment in the atmosphere at 120° C. for 1 hour, then baking in the $O_2$ atmosphere at 400° C. for 3 hours, and then annealing in the atmosphere at 500° C. for 1 hour, to form a first-oxide film as a first gate insulating layer 23a. The average film thickness of the first gate insulating layer was about 25 nm.

—Formation of Gate Electrode—

Next, a gate electrode 22 was formed on the first gate insulating layer. Specifically, a Mo (molybdenum) film was formed on the first gate insulating layer by DC sputtering so as to have an average film thickness of about 100 nm. Thereafter, a photoresist was coated on the Mo film, and the resultant was subjected to prebake, exposure by an exposing device, and developing, to form a resist pattern having the same pattern as a pattern of the gate electrode 22 to be formed. Moreover, resist-pattern-free regions of the Mo film were removed by etching. Thereafter, the resist pattern was also removed to form the gate electrode 22 formed of the Mo film, to complete a field-effect transistor.

Comparative Example 1

<Production of Field-Effect Transistor>

Figure 10A:
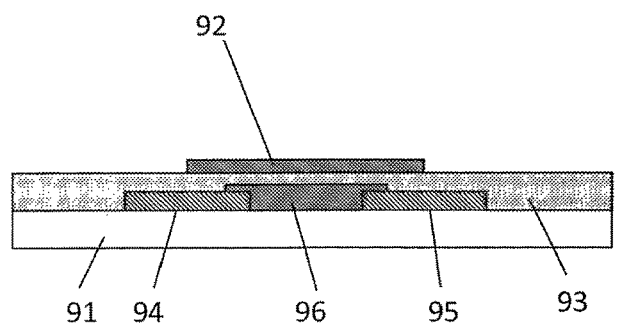
FIG. 10A is a schematic view illustrating field-effect transistors produced in Comparative Example 3 and Comparative Example 5.
Figure 10B:
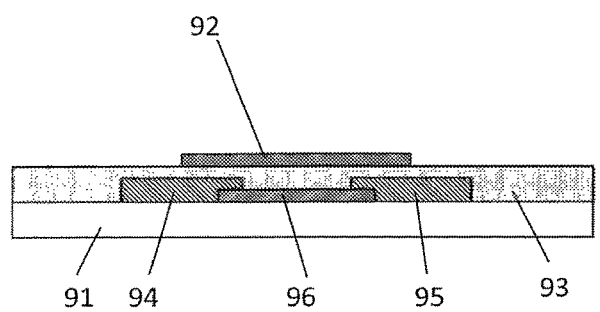
FIG. 10B is a schematic view illustrating field-effect transistors produced in Comparative Example 4 and Comparative Example 6.
Figure 10C:
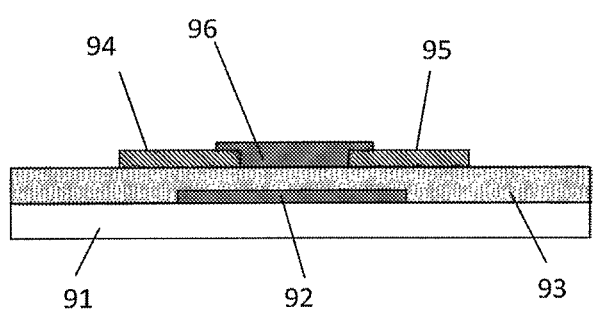
FIG. 10C is a schematic view illustrating field-effect transistors produced in Comparative Example 1 and Comparative Example 7.

Next, a bottom contact/bottom gate field-effect transistor as illustrated in FIG. 10C was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a $SiO_2$ film was formed on the substrate and the gate electrode by CVD (Chemical Vapor Deposition) so as to have an average film thickness of about 300 nm.

—Formation of Source Electrode and Drain Electrode—

Next, a source electrode 94 and a drain electrode 95 were formed on the gate insulating layer 93. Specifically, a Ti (titanium) film was formed on the gate insulating layer 93 by DC sputtering so as to have an average film thickness of about 100 nm. Thereafter, a photoresist was coated on the Ti film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Ti film were removed by etching. Thereafter, the resist pattern was also removed to form the source electrode 94 and the drain electrode 95, each of which was formed of the Ti film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95, to complete a field-effect transistor.

Comparative Example 2

<Production of Field-Effect Transistor>

Figure 10D:
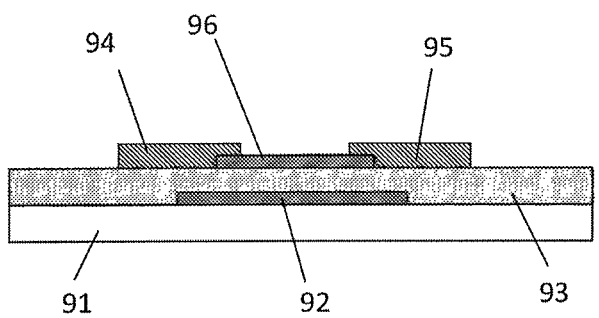
FIG. 10D is a schematic view illustrating field-effect transistors produced in Comparative Example 2 and Comparative Example 8.

Next, a top contact/bottom gate field-effect transistor as illustrated in FIG. 10D was produced.

—Formation of Gate Electrode—

First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.

—Formation of Gate Insulating Layer—

Next, a gate insulating layer 93 was formed on the substrate and the gate electrode. Specifically, a $SiO_2$ film was formed on the substrate and the gate electrode by CVD (Chemical Vapor Deposition) so as to have an average film thickness of about 300 nm.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96.

—Formation of Source Electrode and Drain Electrode—

Next, a source electrode 94 and a drain electrode 95 were formed on the gate insulating layer 93 and the oxide semiconductor layer 96. Specifically, a Ta (tantalum) film was formed on the gate insulating layer 93 and the oxide semiconductor layer 96 by DC sputtering so as to have an average film thickness of about 100 nm. Thereafter, a photoresist was coated on the Ta film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Ta film were removed by etching. Thereafter, the resist pattern was also removed to form the source electrode 94 and the drain electrode 95, each of which was formed of the Ta film. As a result, the source electrode 94 and the drain electrode 95 were formed on the oxide semiconductor layer 96 in an arrangement that a channel was formed, to complete a field-effect transistor.

Comparative Example 3

<Production of Field-Effect Transistor>

Next, a bottom contact/top gate field-effect transistor as illustrated in FIG. 10A was produced.

—Formation of Source Electrode and Drain Electrode—

First, a source electrode 94 and a drain electrode 95 were formed on a glass substrate (substrate 91). Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by etching. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Gate Insulating Layer—

Next, a gate insulating layer 93 was formed on the substrate and the gate electrode. Specifically, a $SiO_2$ film was formed on the substrate and the gate electrode by CVD (Chemical Vapor Deposition) so as to have an average film thickness of about 300 nm.

—Formation of Gate Electrode—

Next, a gate electrode 92 was formed on the first gate insulating layer. Specifically, an Ag (silver) film was formed on the first gate insulating layer by DC sputtering so as to have an average film thickness of about 100 nm. Thereafter, a photoresist was coated on the Ag film, and the resultant was subjected to prebake, exposure by an exposing device, and developing, to form a resist pattern having the same pattern as a pattern of the gate electrode 92 to be formed. Moreover, resist-pattern-free regions of the Ag film were removed by etching. Thereafter, the resist pattern was also removed to form the gate electrode 92 formed of the Ag film, to complete a field-effect transistor.

Comparative Example 4

<Production of Field-Effect Transistor>

Next, a top contact/top gate field-effect transistor as illustrated in FIG. 10B was produced.

—Formation of Oxide Semiconductor Layer—

First, an oxide semiconductor layer 96 was formed on a glass substrate (substrate 91). Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96.

—Formation of Source Electrode and Drain Electrode—

Next, a source electrode 94 and a drain electrode 95 were formed on the substrate and the oxide semiconductor layer. Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by etching. Thereafter, the resist pattern was also removed to form the source electrode 94 and the drain electrode 95, each of which was formed of the Al alloy film.

—Formation of Gate Insulating Layer—

Next, a gate insulating layer 93 was formed on the substrate and the gate electrode. Specifically, a SiO$_2$ film was formed on the substrate and the gate electrode by CVD (Chemical Vapor Deposition) so as to have an average film thickness of about 300 nm.

—Formation of Gate Electrode—

Next, a gate electrode 92 was formed on the first gate insulating layer. Specifically, a Cu (copper) film was formed on the first gate insulating layer by DC sputtering so as to have an average film thickness of about 100 nm. Thereafter, a photoresist was coated on the Cu film, and the resultant was subjected to prebake, exposure by an exposing device, and developing, to form a resist pattern having the same pattern as a pattern of the gate electrode 92 to be formed. Moreover, resist-pattern-free regions of the Cu film were removed by etching. Thereafter, the resist pattern was also removed to form the gate electrode 92 formed of the Cu film, to complete a field-effect transistor.

Comparative Example 5

<Production of Field-Effect Transistor>

Next, a bottom contact/top gate field-effect transistor as illustrated in FIG. 10A was produced.

—Formation of Source Electrode and Drain Electrode—

First, a source electrode 94 and a drain electrode 95 were formed on a glass substrate (substrate 91). Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by etching. Thereafter, the resist pattern was also removed to form the source electrode 94 and the drain electrode 95, each of which was formed of the Al alloy film.

—Formation of Oxide Semiconductor Layer—

Next, an oxide semiconductor layer 96 was formed. Specifically, a Mg—In based oxide (In$_2$MgO$_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95.

—Formation of Gate Insulating Layer—

Next, a gate insulating layer 93 was formed on the substrate and the gate electrode. Specifically, a SiO$_2$ film was formed on the substrate and the gate electrode by CVD (Chemical Vapor Deposition) so as to have an average film thickness of about 300 nm.

—Formation of Gate Electrode—

Next, a gate electrode 92 was formed on the first gate insulating layer. Specifically, an Al (aluminium) film was formed on the first gate insulating layer by DC sputtering so as to have an average film thickness of about 100 nm. Thereafter, a photoresist was coated on the Al film, and the resultant was subjected to prebake, exposure by an exposing device, and developing, to form a resist pattern having the same pattern as a pattern of the gate electrode 92 to be formed. Moreover, resist-pattern-free regions of the Al film were removed by etching. Thereafter, the resist pattern was also removed to form the gate electrode 92 formed of the Al film, to complete a field-effect transistor.

Comparative Example 6

<Production of Field-Effect Transistor>

Next, a top contact/top gate field-effect transistor as illustrated in FIG. 10B was produced.

—Formation of Oxide Semiconductor Layer—

First, an oxide semiconductor layer 96 was formed on a glass substrate (substrate 91). Specifically, a Mg—In based oxide (In$_2$MgO$_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96.

—Formation of Source Electrode and Drain Electrode—

Next, a source electrode 94 and a drain electrode 95 were formed on the substrate and the oxide semiconductor layer. Specifically, an Al (aluminium) alloy film was formed on the substrate by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by etching. Thereafter, the resist pattern was also removed to form the source electrode 94 and the drain electrode 95, each of which was formed of the Al alloy film.

—Formation of Gate Insulating Layer—

Next, a gate insulating layer 93 was formed on the substrate and the gate electrode. Specifically, a SiO$_2$ film was formed on the substrate and the gate electrode by CVD (Chemical Vapor Deposition) so as to have an average film thickness of about 300 nm.

—Formation of Gate Electrode—

Next, a gate electrode 92 was formed on the first gate insulating layer. Specifically, an Al (aluminium) film was formed on the first gate insulating layer by DC sputtering so as to have an average film thickness of about 100 nm. Thereafter, a photoresist was coated on the Al film, and the resultant was subjected to prebake, exposure by an exposing device, and developing, to form a resist pattern having the same pattern as a pattern of the gate electrode 92 to be formed. Moreover, resist-pattern-free regions of the Al film were removed by etching. Thereafter, the resist pattern was also removed to form the gate electrode 92 formed of the Al film, to complete a field-effect transistor.

Comparative Example 7

<Production of Field-Effect Transistor>
Next, a bottom contact/bottom gate field-effect transistor as illustrated in FIG. 10C was produced.
—Formation of Gate Electrode—
First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.
—Formation of Gate Insulating Layer—
Next, a gate insulating layer 93 was formed on the substrate and the gate electrode. Specifically, a $SiO_2$ film was formed on the substrate and the gate electrode by CVD (Chemical Vapor Deposition) so as to have an average film thickness of about 300 nm.
—Formation of Source Electrode and Drain Electrode—
Next, a source electrode 94 and a drain electrode 95 were formed on the gate insulating layer 93. Specifically, an Al (aluminium) alloy film was formed on the gate insulating layer 93 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by etching. Thereafter, the resist pattern was also removed to form the source electrode 94 and the drain electrode 95, each of which was formed of the Al alloy film.
—Formation of Oxide Semiconductor Layer—
Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96. As a result, the oxide semiconductor layer 96 was formed in a manner that a channel was formed between the source electrode 94 and the drain electrode 95, to complete a field-effect transistor.

Comparative Example 8

<Production of Field-Effect Transistor>
Next, a top contact/bottom gate field-effect transistor as illustrated in FIG. 10D was produced.
—Formation of Gate Electrode—
First, a gate electrode 92 was formed on a glass substrate (substrate 91). Specifically, an Al (aluminium) alloy film was formed on the glass substrate (substrate 91) by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the gate electrode 92 to be formed. Moreover, resist-pattern-free regions of the Al alloy film were removed by etching. Thereafter, the resist pattern was also removed to form the gate electrode 92 formed of the Al alloy film.
—Formation of Gate Insulating Layer—
Next, a gate insulating layer 93 was formed on the substrate and the gate electrode. Specifically, a $SiO_2$ film was formed on the substrate and the gate electrode by CVD (Chemical Vapor Deposition) so as to have an average film thickness of about 300 nm.
—Formation of Oxide Semiconductor Layer—
Next, an oxide semiconductor layer 96 was formed. Specifically, a Mg—In based oxide ($In_2MgO_4$) film was formed by DC sputtering so as to have an average film thickness of about 100 nm. Thereafter, a photoresist was coated on the Mg—In based oxide film, and the resultant was subjected to prebake, exposure by an exposing device, and developing, to form a resist pattern having the same pattern as a pattern of the oxide semiconductor layer 96 to be formed. Moreover, resist-pattern-free regions of the Mg—In based oxide film were removed by etching. Thereafter, the resist pattern was also removed to form the oxide semiconductor layer 96.
—Formation of Source Electrode and Drain Electrode—
Next, a source electrode 94 and a drain electrode 95 were formed on the gate insulating layer 93 and the oxide semiconductor layer 96. Specifically, an Al (aluminium) alloy film was formed on the gate insulating layer 93 and the oxide semiconductor layer 96 by DC sputtering so as to have an average film thickness of about 100 nm. Thereafter, a photoresist was coated on the Al alloy film, and the resultant was subjected to prebake, exposure by an exposing device, and developing, to form a resist pattern having the same pattern as a pattern of the source electrode 94 and the drain electrode 95 to be formed. Moreover, resist-pattern-free regions of the Al alloy film were removed by etching. Thereafter, the resist pattern was also removed to form the source electrode 94 and the drain electrode 95, each of which was formed of the Al alloy film As a result, the source electrode 94 and the drain electrode 95 were formed on the oxide semiconductor layer 96 in an arrangement that a channel was formed, to complete a field-effect transistor.

TABLE 1-1

|  | Oxide | Ex. 1 Ratios by mole of oxides mol % | Ex. 2 Ratios by mole of oxides mol % | Ex. 3 Ratios by mole of oxides mol % | Ex. 4 Ratios by mole of oxides mol % |
|---|---|---|---|---|---|
| First oxide | $SiO_2$ | 83.1 | 68.2 | 72.7 | 65.8 |
|  | $Al_2O_3$ |  |  |  |  |
|  | $B_2O_3$ |  |  |  |  |
|  | MgO | 16.9 |  |  |  |
|  | CaO |  | 10.5 |  |  |
|  | SrO |  | 21.3 |  | 34.2 |
|  | BaO |  |  | 27.3 |  |
|  | Total | 100.0 | 100.0 | 100.0 | 100.0 |

TABLE 1-1-continued

| Oxide | | Ex. 1 Ratios by mole of oxides mol % | Ex. 2 Ratios by mole of oxides mol % | Ex. 3 Ratios by mole of oxides mol % | Ex. 4 Ratios by mole of oxides mol % |
|---|---|---|---|---|---|
| Second oxide (paraelectric amorphous oxide) | $Sc_2O_3$ | 67.3 | | | |
| | $Y_2O_3$ | | | | |
| | $La_2O_3$ | | | | 77.9 |
| | $Nd_2O_3$ | | | | |
| | $Sm_2O_3$ | | 40.6 | | |
| | $Eu_2O_3$ | | | 70.5 | |
| | $Gd_2O_3$ | | 44.4 | | |
| | $Dy_2O_3$ | | | | |
| | $Yb_2O_3$ | | | | |
| | MgO | | | 29.5 | |
| | CaO | 32.7 | | | |
| | SrO | | | | 22.1 |
| | BaO | | 15.0 | | |
| | $ZrO_2$ | | | | |
| | $HfO_2$ | | | | |
| | Total | 100.0 | 100.0 | 100.0 | 100.0 |

TABLE 1-2

| Oxide | | Ex. 5 Ratios by mole of oxides mol % | Ex. 6 Ratios by mole of oxides mol % | Ex. 7 Ratios by mole of oxides mol % | Ex. 8 Ratios by mole of oxides mol % |
|---|---|---|---|---|---|
| First oxide | $SiO_2$ | 70.5 | 80.8 | 60.6 | 77.3 |
| | $Al_2O_3$ | 10.1 | | 10.2 | 6.6 |
| | $B_2O_3$ | | 6.5 | 5.4 | 3.0 |
| | MgO | | 7.6 | | |
| | CaO | | | | 13.1 |
| | SrO | | | 23.8 | |
| | BaO | 19.4 | 5.1 | | |
| | Total | 100.0 | 100.0 | 100.0 | 100.0 |
| Second oxide (paraelectric amorphous oxide) | $Sc_2O_3$ | | | | |
| | $Y_2O_3$ | | 77.9 | | |
| | $La_2O_3$ | | | | |
| | $Nd_2O_3$ | 65.5 | | | |
| | $Sm_2O_3$ | | | | |
| | $Eu_2O_3$ | | | | |
| | $Gd_2O_3$ | | | 81.3 | |
| | $Dy_2O_3$ | | | | |
| | $Yb_2O_3$ | | | | 62.8 |
| | MgO | | 17.1 | | |
| | CaO | | | 18.7 | |
| | SrO | 34.5 | 5.0 | | |
| | BaO | | | | 37.2 |
| | $ZrO_2$ | | | | |
| | $HfO_2$ | | | | |
| | Total | 100.0 | 100.0 | 100.0 | 100.0 |

TABLE 1-3

| Oxide | | Ex. 9 Ratios by mole of oxides mol % | Ex. 10 Ratios by mole of oxides mol % | Ex. 11 Ratios by mole of oxides mol % | Ex. 12 Ratios by mole of oxides mol % |
|---|---|---|---|---|---|
| First oxide | $SiO_2$ | 67.3 | 79.3 | 82.4 | 84.5 |
| | $Al_2O_3$ | | | | |
| | $B_2O_3$ | | | | |
| | MgO | 32.7 | | | |
| | CaO | | | | 10.0 |
| | SrO | | | 17.6 | 5.5 |
| | BaO | | 20.7 | | |
| | Total | 100.0 | 100.0 | 100.0 | 100.0 |
| Second oxide (paraelectric amorphous oxide) | $Sc_2O_3$ | | | | 55.2 |
| | $Y_2O_3$ | | | | |
| | $La_2O_3$ | | | 70.5 | |
| | $Nd_2O_3$ | | | | |
| | $Sm_2O_3$ | | 40.0 | | 20.0 |
| | $Eu_2O_3$ | 83.3 | | | |
| | $Gd_2O_3$ | | | | |
| | $Dy_2O_3$ | | 33.8 | | |
| | $Yb_2O_3$ | | | | |
| | MgO | | | 21.6 | |
| | CaO | 10.7 | | | |
| | SrO | | 14.7 | | |
| | BaO | | | | 12.1 |
| | $ZrO_2$ | 6.0 | | 2.4 | 12.7 |
| | $HfO_2$ | | 11.5 | 5.5 | |
| | Total | 100.0 | 100.0 | 100.0 | 100.0 |

TABLE 1-4

| Oxide | | Ex. 13 Ratios by mole of oxides mol % | Ex. 14 Ratios by mole of oxides mol % | Ex. 15 Ratios by mole of oxides mol % | Ex. 16 Ratios by mole of oxides mol % |
|---|---|---|---|---|---|
| First oxide | $SiO_2$ | 69.4 | 68.8 | 67.5 | 75.0 |
| | $Al_2O_3$ | 10.5 | | 10.7 | 1.1 |
| | $B_2O_3$ | | 15.2 | 11.8 | |
| | MgO | 20.1 | | | |
| | CaO | | 10.5 | 7.4 | |
| | SrO | | 5.5 | 2.6 | |
| | BaO | | | | 23.9 |
| | Total | 100.0 | 100.0 | 100.0 | 100.0 |
| Second oxide (paraelectric amorphous oxide) | $Sc_2O_3$ | | 85.2 | | |
| | $Y_2O_3$ | | | | |
| | $La_2O_3$ | | | 66.6 | |
| | $Nd_2O_3$ | | | | |
| | $Sm_2O_3$ | | | | |
| | $Eu_2O_3$ | | | | |
| | $Gd_2O_3$ | | | | 71.9 |
| | $Dy_2O_3$ | | | | |
| | $Yb_2O_3$ | 75.9 | | | |
| | MgO | | | | 20.0 |
| | CaO | 10.2 | 8.8 | | |
| | SrO | 5.5 | | 16.7 | |
| | BaO | | | | |
| | $ZrO_2$ | 8.4 | 3.3 | 16.7 | 5.1 |
| | $HfO_2$ | | 2.7 | | 3.0 |
| | Total | 100.0 | 100.0 | 100.0 | 100.0 |

<Evaluation of Transistor Characteristics of Field-Effect Transistors>

Transistor characteristics of each of the field-effect transistors produced in Examples 1 to 16 and Comparative Examples 1 to 8 were evaluated. The transistor characteristics of the field-effect transistors of Examples 1 to 16 were evaluated by measuring a relationship (Vgs-Ids) between the voltage (Vgs) between the gate electrode 22 and the source electrode 24 and the current (Ids) between the drain electrode 25 and the source electrode 24, when the voltage between the drain electrode 25 and the source electrode 24

(Vds) was +10 V. The transistor characteristics of the field-effect transistors of Comparative Examples 1 to 8 were evaluated by measuring a relationship (Vgs-Ids) between the voltage (Vgs) between the gate electrode 92 and the source electrode 94 and the current (Ids) between the drain electrode 95 and the source electrode 94, when the voltage between the drain electrode 95 and the source electrode 94 (Vds) was +10 V.

Moreover, a field-effect mobility in a saturated region was calculated from the evaluation result of the transistor characteristics (Vgs-Ids). An Ids ratio (on/off ratio) of an on-state (e.g., Vgs=+10 V) to an off-state (e.g., Vgs=−10 V) of the transistor was calculated. A subthreshold swing (SS) was calculated as an index for sharpness of the rise of Ids upon the application of Vgs. Furthermore, threshold voltage (Vth) was calculated as a voltage vale at the time of the rise of Ids upon the application of Vgs.

Table 2 presents the mobility, the on/off ratio, the subthreshold swing, and the Vth calculated from the transistor characteristics of each of the field-effect transistors produced in Examples 1 to 16 and Comparative Examples 1 to 8. In the results of the transistor characteristics described below, the following results: the mobility is high, the on/off ratio is high, the subthreshold swing is low, and the Vth is around 0 V, are expressed as excellent transistor characteristics. Specifically, when the mobility is 5 cm$^2$/Vs or greater, the on/off ratio is $1.0 \times 10^8$ or greater, the subthreshold swing is 0.7 or less, and the Vth is within a range of ±5 V, the results are expressed as excellent transistor characteristics.

It is found from Table 2 that the field-effect transistors produced in Examples 1 to 16 had the excellent transistor characteristics; i.e., the mobility is high, the on/off ratio is high, the subthreshold swing is 0.7 or less, and the Vth is around 0 V.

On the other hand, it is found from Table 2 that the field-effect transistors produced in Comparative Examples 1 to 4 could not be measured for transistor characteristics because the gate insulating layers received damage due to the etching step in the production of the transistors. Also, from Table 2, the field-effect transistors produced in Comparative Examples 5 to 8 had the low mobility, the low on/off ratio, and the high subthreshold swing, and can be said to have poor transistor characteristics as compared with Examples 1 to 16.

TABLE 2

| | TFT characteristics | | | |
|---|---|---|---|---|
| | Mobility [cm$^2$/Vs] | on/off [×10$^8$] | Subthreshold swing [V/decade] | Vth [V] |
| Ex. 1 | 10.4 | 9.5 | 0.25 | 3.0 |
| Ex. 2 | 7.2 | 4.6 | 0.53 | 4.2 |
| Ex. 3 | 6.9 | 3.3 | 0.58 | 4.6 |
| Ex. 4 | 11.3 | 8.9 | 0.33 | 3.6 |
| Ex. 5 | 8.9 | 5.7 | 0.29 | 4.8 |
| Ex. 6 | 5.8 | 2.5 | 0.61 | 2.9 |
| Ex. 7 | 7.1 | 2.1 | 0.55 | 4.0 |
| Ex. 8 | 12.0 | 7.9 | 0.34 | 4.9 |
| Ex. 9 | 8.4 | 5.3 | 0.21 | 3.6 |
| Ex. 10 | 7.5 | 3.5 | 0.64 | 2.2 |
| Ex. 11 | 6.4 | 4.6 | 0.71 | 4.8 |
| Ex. 12 | 11.5 | 8.3 | 0.36 | 3.7 |
| Ex. 13 | 9.6 | 6.0 | 0.38 | 4.1 |
| Ex. 14 | 7.3 | 3.5 | 0.66 | 3.6 |
| Ex. 15 | 7.1 | 3.9 | 0.60 | 2.6 |
| Ex. 16 | 12.5 | 8.8 | 0.28 | 4.9 |
| Comp. Ex. 1 | Non measurable | | | |
| Comp. Ex. 2 | Non measurable | | | |

TABLE 2-continued

| | TFT characteristics | | | |
|---|---|---|---|---|
| | Mobility [cm$^2$/Vs] | on/off [×10$^8$] | Subthreshold swing [V/decade] | Vth [V] |
| Comp. Ex. 3 | Non measurable | | | |
| Comp. Ex. 4 | Non measurable | | | |
| Comp. Ex. 5 | 1.2 | 0.5 | 0.75 | 2.7 |
| Comp. Ex. 6 | 2.5 | 0.8 | 0.80 | 3.8 |
| Comp. Ex. 7 | 1.3 | 0.7 | 0.91 | 3.1 |
| Comp. Ex. 8 | 1.9 | 0.9 | 0.77 | 4.6 |

<Reliability Evaluation of Field-Effect Transistor>

A bias temperature stress (BTS) test was performed on each of the field-effect transistors produced in Examples 1 to 16 and Comparative Examples 5 to 8 in the atmosphere (temperature: 50° C. and relative humidity: 50%) for 100 hours.

The stress conditions were the following four conditions:

$$Vgs=+10 \text{ V and } Vds=0 \text{ V}; \quad (1)$$

$$Vgs=+10 \text{ V and } Vds=+10 \text{ V}; \quad (2)$$

$$Vgs=-10 \text{ V and } Vds=0 \text{ V}; \text{ and} \quad (3)$$

$$Vgs=-10V \text{ and } Vds=+10 \text{ V}. \quad (4)$$

Every time the BTS test proceeded for a certain period of time, a relationship (Vgs-Ids) between Vgs and Ids when Vds=+10 V was measured.

Figure 11:
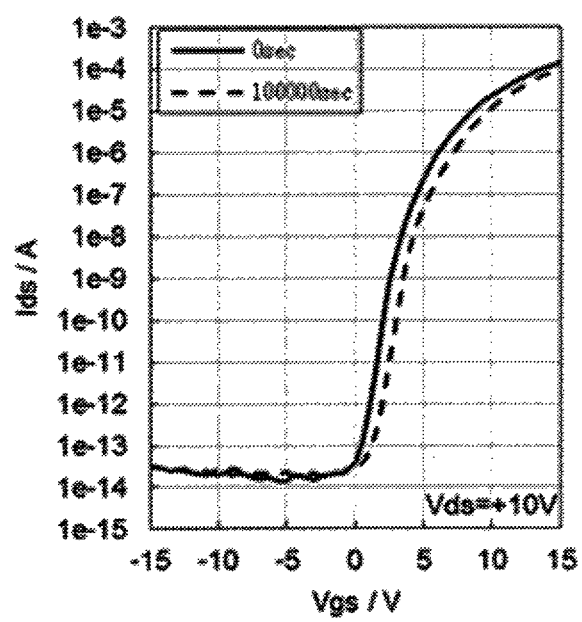
FIG. 11 is a graph in which transistor characteristics (Vgs-Ids) of a field-effect transistor obtained in Example 13 in a BTS test with Vgs=+10 V and Vds=0 V are evaluated.
Figure 12:
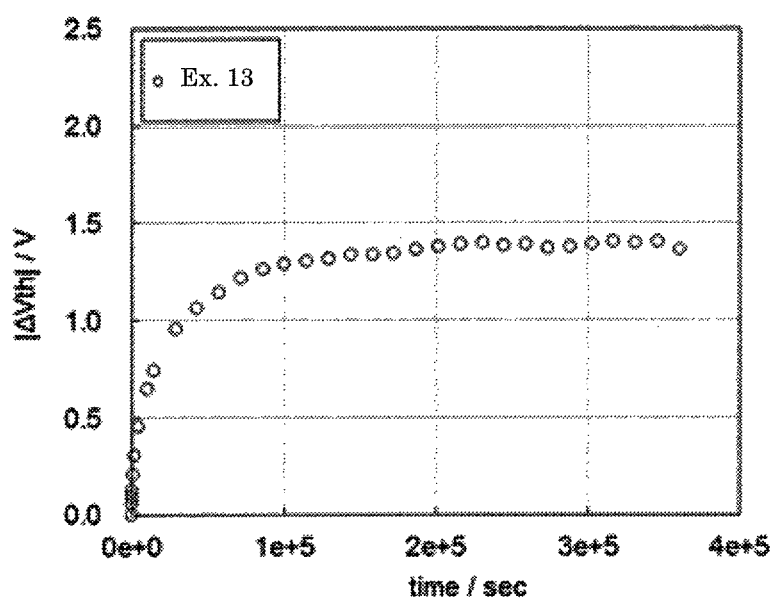
FIG. 12 is a graph in which change ΔVth with respect to stress time of a field-effect transistor obtained in Example 13 in a BTS test with Vgs=+10 V and Vds=0 V are evaluated.

FIG. 11 presents the result of Vgs-Ids in the BTS test performed on the field-effect transistor produced in Example 13, where the stress conditions were Vgs=+10 V and Vds=0 V. FIG. 12 presents the change of the threshold voltage (ΔVth) with respect to the stress time in each of the field-effect transistor produced in Example 13 under the stress conditions of Vgs=+10 V and Vds=0 V.

Figure 13:
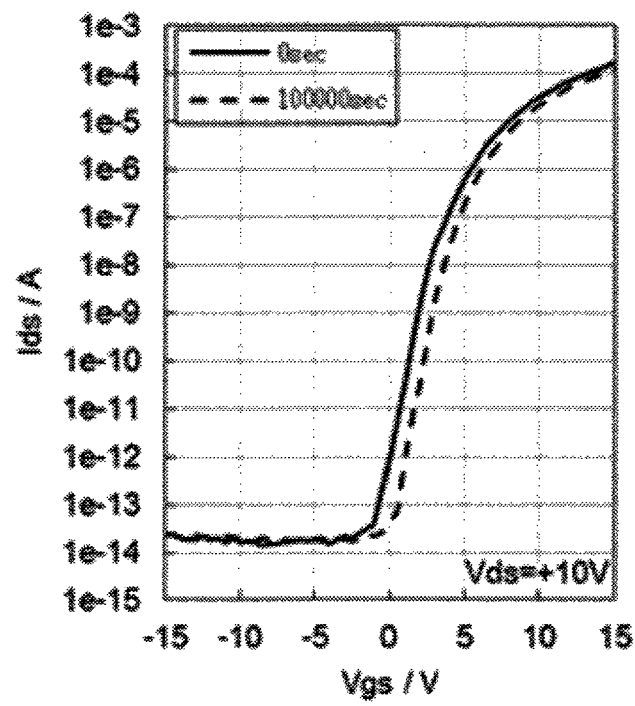
FIG. 13 is a graph in which transistor characteristics (Vgs-Ids) of a field-effect transistor obtained in Example 15 in a BTS test with Vgs=+10 V and Vds=0 V are evaluated.
Figure 14:
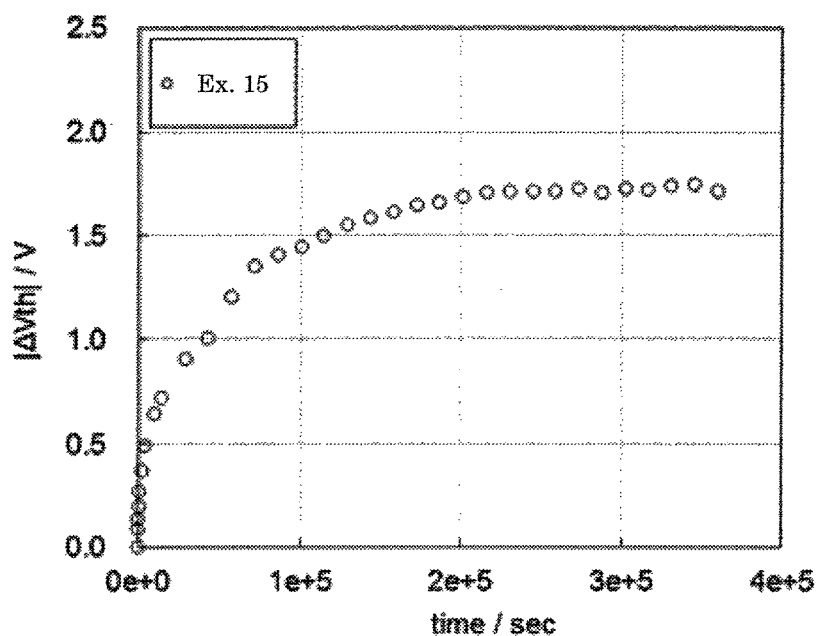
FIG. 14 is a graph in which change ΔVth with respect to stress time of a field-effect transistor obtained in Example 15 in a BTS test with Vgs=+10 V and Vds=0 V are evaluated.

FIG. 13 presents the result of Vgs-Ids in the BTS test performed on the field-effect transistor produced in Example 15, where the stress conditions were Vgs=+10 V and Vds=0 V. FIG. 14 presents the change of the threshold voltage (ΔVth) with respect to the stress time in each of the field-effect transistor produced in Example 15 under the stress conditions of Vgs=+10 V and Vds=0 V.

Figure 15:
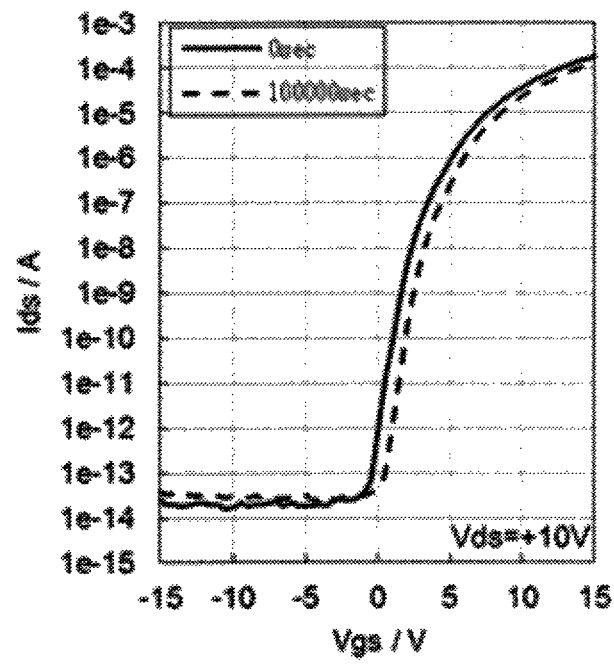
FIG. 15 is a graph in which transistor characteristics (Vgs-Ids) of a field-effect transistor obtained in Example 16 in a BTS test with Vgs=+10 V and Vds=0 V are evaluated.
Figure 16:
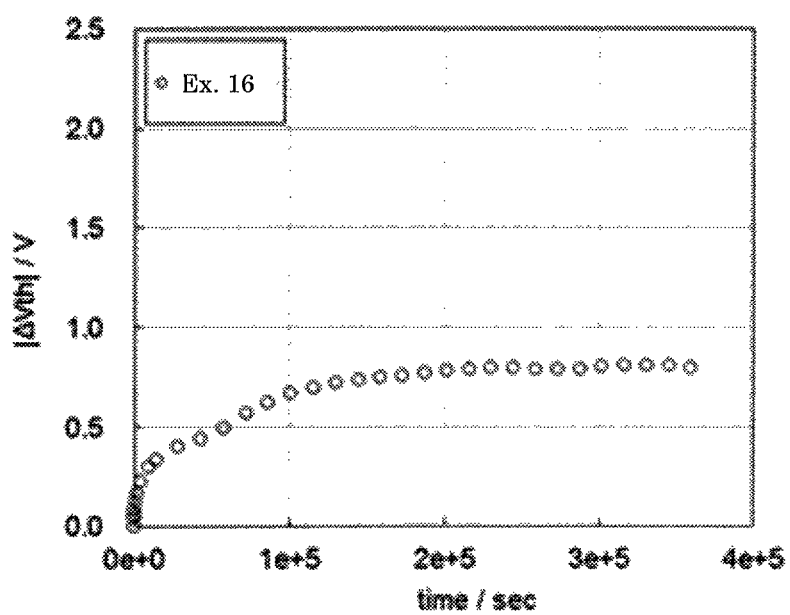
FIG. 16 is a graph in which change ΔVth with respect to stress time of a field-effect transistor obtained in Example 16 in a BTS test with Vgs=+10 V and Vds=0 V are evaluated.

FIG. 15 presents the result of Vgs-Ids in the BTS test performed on the field-effect transistor produced in Example 16, where the stress conditions were Vgs=+10 V and Vds=0 V. FIG. 16 presents the change of the threshold voltage (ΔVth) with respect to the stress time in each of the field-effect transistor produced in Example 16 under the stress conditions of Vgs=+10 V and Vds=0 V.

Figure 17:
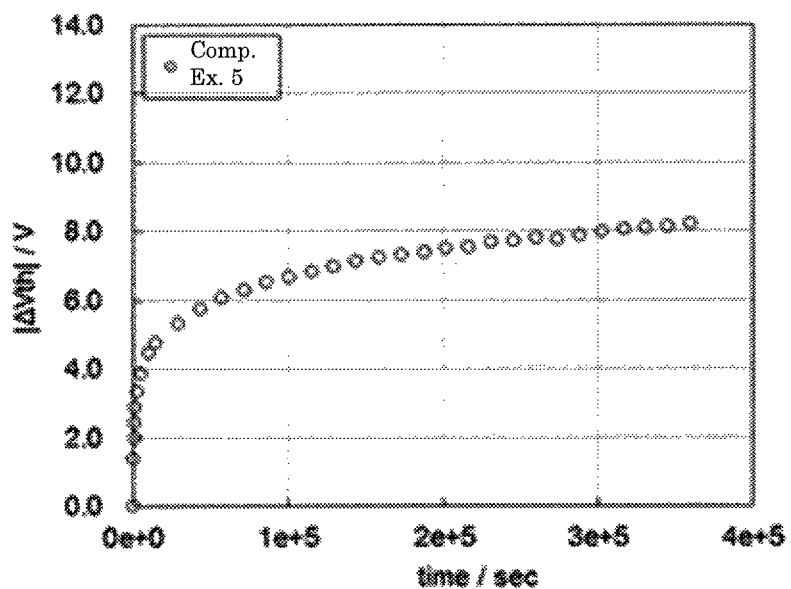
FIG. 17 is a graph in which change ΔVth with respect to stress time of a field-effect transistor obtained in Comparative Example 5 in a BTS test with Vgs=+10 V and Vds=0 V are evaluated.

FIG. 17 presents the change of the threshold voltage (ΔVth) with respect to the stress time in each of the field-effect transistor produced in Comparative Example 5 under the stress conditions of Vgs=+10 V and Vds=0 V.

Figure 18:
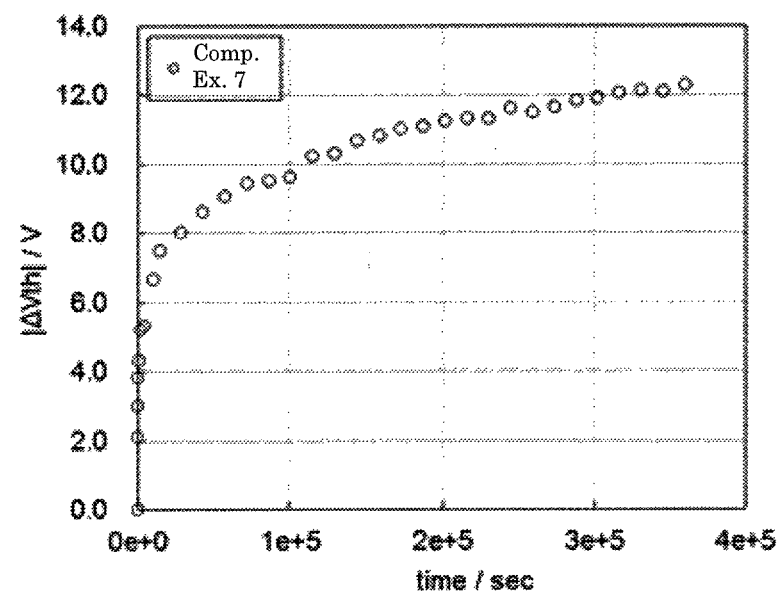
FIG. 18 is a graph in which change ΔVth with respect to stress time of a field-effect transistor obtained in Comparative Example 7 in a BTS test with Vgs=+10 V and Vds=0 V are evaluated.

FIG. 18 presents the change of the threshold voltage (ΔVth) with respect to the stress time in each of the field-effect transistor produced in Comparative Example 7 under the stress conditions of Vgs=+10 V and Vds=0 V.

Here, "e" in the vertical axis in the graphs of FIGS. 11, 13, and 15 and in the horizontal axis in the graphs of FIGS. 12, 14, 16, 17, and 18 denotes "the exponent of 10." For example, "1e−3" denotes "$1.0 \times 10^{-3}$" and "0.001" and "1e+05" denotes "$1.0 \times 10^{+5}$" and "100,000."

Also, Table 3 presents the values of ΔVth with respect to the stress time of 100 hours in the BTS test performed on each of the field-effect transistors of Examples 1 to 16 and Comparative Examples 5 to 8. Here, "ΔVth" denotes a change of Vth from 0 hours of the stress time through a certain stress time.

It is found from FIGS. 11 and 12 and Table 3 that the field-effect transistor produced in Example 13 had a small shift in ΔVth and exhibited excellent reliability in the BTS test. Similarly, it could be confirmed from Table 3 that each of the field-effect transistors produced in Examples 1, 5, and 9 had a small shift in ΔVth and exhibited excellent reliability in the BTS test.

It is found from FIGS. 13 and 14 and Table 3 that the field-effect transistor produced in Example 15 had a small shift in ΔVth and exhibited excellent reliability in the BTS test. Similarly, it could be confirmed from Table 3 that each of the field-effect transistors produced in Examples 3, 7, and 11 had a small shift in ΔVth and exhibited excellent reliability in the BTS test.

It is found from FIGS. 15 and 16 and Table 3 that the field-effect transistor produced in Example 16 had a small shift in ΔVth and exhibited excellent reliability in the BTS test. Similarly, it could be confirmed from Table 3 that each of the field-effect transistors produced in Examples 4, 8, and 12 had a small shift in ΔVth and exhibited excellent reliability in the BTS test.

On the other hand, as presented in FIG. 17 and Table 3, the field-effect transistor produced in Comparative Example 5 had a large shift in ΔVth and exhibited insufficient reliability in the BTS test. Similarly, as presented in Table 3, the field-effect transistor produced in Comparative Example 6 had a large shift in ΔVth and exhibited insufficient reliability in the BTS test.

On the other hand, as presented in FIG. 18 and Table 3, the field-effect transistor produced in Comparative Example 7 had a large shift in ΔVth and exhibited insufficient reliability in the BTS test. Similarly, as presented in Table 3, the field-effect transistor produced in Comparative Example 8 had a large shift in ΔVth and exhibited insufficient reliability in the BTS test.

TABLE 3

| | After application of stress for 100 hours | | | |
|---|---|---|---|---|
| | Stress conditions Vgs = +10 V Vds = 0 V ΔVth [V] | Stress conditions Vgs = +10 V Vds = +10 V ΔVth [V] | Stress conditions Vgs = −10 V Vds = 0 V ΔVth [V] | Stress conditions Vgs = −10 V Vds = +10 V ΔVth [V] |
| Ex. 1 | 1.21 | 1.57 | −0.75 | −0.64 |
| Ex. 2 | — | — | — | — |
| Ex. 3 | 1.55 | 1.36 | −0.94 | −0.72 |
| Ex. 4 | 0.85 | 0.69 | −0.41 | −0.40 |
| Ex. 5 | 1.60 | 1.32 | −0.68 | −0.83 |
| Ex. 6 | — | — | — | — |
| Ex. 7 | 1.34 | 1.68 | −0.58 | −0.97 |
| Ex. 8 | 0.77 | 0.71 | −0.39 | −0.36 |
| Ex. 9 | 1.86 | 1.79 | −0.72 | −0.67 |
| Ex. 10 | — | — | — | — |
| Ex. 11 | 1.29 | 1.73 | −0.62 | −0.52 |
| Ex. 12 | 0.80 | 0.65 | −0.38 | −0.43 |
| Ex. 13 | 1.36 | 1.35 | −0.70 | −0.66 |
| Ex. 14 | — | — | — | — |
| Ex. 15 | 1.75 | 1.67 | −0.82 | −0.71 |
| Ex. 16 | 0.75 | 0.69 | −0.33 | −0.20 |
| Comp. Ex. 5 | 8.45 | 7.39 | −7.33 | −7.43 |
| Comp. Ex. 6 | 12.38 | 11.53 | −8.55 | −6.99 |
| Comp. Ex. 7 | 10.20 | 8.80 | −6.90 | −7.90 |
| Comp. Ex. 8 | 7.40 | 6.30 | −8.00 | −8.20 |

Aspects of the present disclosure are, for example, as follows.

<1> A field-effect transistor including: a gate electrode, which is configured to apply gate voltage;
a source electrode and a drain electrode, which are configured to take electric current out;
a semiconductor layer, which is disposed to be adjacent to the source electrode and the drain electrode; and
a gate insulating layer, which is disposed between the gate electrode and the semiconductor layer,
wherein the gate insulating layer includes a first gate insulating layer containing a first oxide containing Si and an alkaline earth metal and a second gate insulating layer disposed to be in contact with the first gate insulating layer and containing a paraelectric amorphous oxide containing a Group A element which is an alkaline earth metal and a Group B element which is at least one selected from the group consisting of Ga, Sc, Y, and lanthanoid.

<2> The field-effect transistor according to <1>, wherein the first oxide contains at least one of Al and B.

<3> The field-effect transistor according to <1> or <2>, wherein the paraelectric amorphous oxide contains at least one of Al, Ti, Zr, Hf, Nb, and Ta.

<4> The field-effect transistor according to any one of <1> to <3>, wherein the field-effect transistor is a top gate field-effect transistor.

<5> The field-effect transistor according to any one of <1> to <3>, wherein the field-effect transistor is a bottom gate field-effect transistor.

<6> The field-effect transistor according to any one of <1> to <5>, wherein the first gate insulating layer is in contact with the semiconductor layer.

<7> The field-effect transistor according to any one of <1> to <5>, wherein the second gate insulating layer is in contact with the semiconductor layer.

<8> The field-effect transistor according to any one of <1> to <5>, wherein the semiconductor layer contains an oxide semiconductor.

<9> A display element including:
a light control element configured to control light output according to a driving signal; and
a driving circuit containing the field-effect transistor according to any one of <1> to <8> and configured to drive the light control element.

<10> The display element according to <9>, wherein the light control element contains an electroluminescent element, an electrochromic element, a liquid crystal element, an electrophoretic element, or an electrowetting element.

<11> An image display device configured to display an image corresponding to image data, the image display device including:
a plurality of display elements arranged in a form of matrix, each of the plurality of display elements being the display element according to <9> or <10>;
a plurality of wired lines configured to individually apply gate voltage to the field-effect transistors in the plurality of display elements; and
a display control device configured to individually control the gate voltage of the field-effect transistors via the plurality of wired lines correspondingly to the image data.

<12> A system including:
the image display device according to <11>; and
an image-data-generating device configured to generate image data based on image information to be displayed and to output the image data to the image display device.

The field-effect transistor according to any one of <1> to <8>, the display element according to <9> or <10>, the image display device according to <11>, and the system according to <12> can solve the above existing problems and achieve the object of the present disclosure.

What is claimed is:

1. A field-effect transistor comprising:
a gate electrode, to which a gate voltage is applied or to be applied;
a source electrode and a drain electrode;
a semiconductor layer, which is disposed to be adjacent to the source electrode and the drain electrode; and
a gate insulating layer, which is disposed between the gate electrode and the semiconductor layer,
wherein the gate insulating layer includes
a first gate insulating layer containing a first oxide containing Si and an alkaline earth metal, and
a second gate insulating layer disposed to be in contact with the first gate insulating layer and containing a paraelectric amorphous oxide containing a Group A element which is-an alkaline earth metal-and a Group B element which is at least one selected from the group consisting of Ga, Sc, Y, and one or more lanthanoids, and
wherein said first gate insulating layer is in contact with the semiconductor layer, the source electrode and the drain electrode, and
said second gate insulating layer is in contact with the gate electrode and is not in contact with the semiconductor layer, the source electrode and the drain electrode.

2. The field-effect transistor according to claim 1, wherein the first oxide further contains at least one of Al and B.

3. The field-effect transistor according to claim 1, wherein the paraelectric amorphous oxide contains at least one of Al, Ti, Zr, Hf, Nb, and Ta.

4. The field-effect transistor according to claim 1, wherein the field-effect transistor is a top gate field-effect transistor.

5. The field-effect transistor according to claim 1, wherein the field-effect transistor is a bottom gate field-effect transistor.

6. The field-effect transistor according to claim 1, wherein the semiconductor layer contains an oxide semiconductor.

7. The field-effect transistor according to claim 1, wherein the alkaline earth metal in the paraelectric amorphous oxide containing the Group A element is at least one selected from the group consisting of Be, Mg, Ca, Sr, and Ba.

8. The field-effect transistor according to claim 1, wherein the first gate insulating layer and the second gate insulating layer are laminated one on the other.

9. The field-effect transistor according to claim 1, wherein the gate insulating layer has a laminated structure disposed in contact with the semiconductor layer in which one of the first gate insulating layer and the second gate insulating layer is laminated on the other.

10. A display element comprising:
a light control element configured to control light output according to a driving signal; and
a driving circuit containing the field-effect transistor according to claim 1 and configured to drive the light control element.

11. The display element according to claim 10, wherein the light control element contains an electroluminescent element, an electrochromic element, a liquid crystal element, an electrophoretic element, or an electrowetting element.

12. An image display device configured to display an image corresponding to image data, the image display device comprising:
a plurality of display elements arranged in a form of matrix, each of the plurality of display elements being the same as the display element according to claim 10;
a plurality of wired lines configured to individually apply gate voltage to the field-effect transistors in the plurality of display elements; and
a display control device configured to individually control the gate voltage of the field-effect transistors via the plurality of wired lines correspondingly to the image data.

13. A system comprising:
the image display device according to claim 12; and
circuitry configured to generate image data based on image information to be displayed and to output the image data to the image display device.

14. A field-effect transistor comprising:
a gate electrode, to which a gate voltage is applied or to be applied;
a source electrode and a drain electrode;
a semiconductor layer, which is disposed to be adjacent to the source electrode and the drain electrode; and
a gate insulating layer, which is disposed between the gate electrode and the semiconductor layer,
wherein the gate insulating layer includes
a first gate insulating layer containing a first oxide containing Si and an alkaline earth metal, and
a second gate insulating layer disposed to be in contact with the first gate insulating layer and containing a paraelectric amorphous oxide containing a Group A element which is-an alkaline earth metal-and a Group B element which is at least one selected from the group consisting of Ga, Sc, Y, and one or more lanthanoids, and
wherein said second gate insulating layer is in contact with the semiconductor layer, the source electrode and the drain electrode, and
said first gate insulating layer is in contact with the gate electrode and is not in contact with the semiconductor layer, the source electrode and the drain electrode.

15. A display element comprising:
a light control element configured to control light output according to a driving signal; and
a driving circuit containing the field-effect transistor according to claim 14 and configured to drive the light control element.

16. The display element according to claim 15, wherein the light control element contains an electroluminescent element, an electrochromic element, a liquid crystal element, an electrophoretic element, or an electrowetting element.

17. An image display device configured to display an image corresponding to image data, the image display device comprising:
a plurality of display elements arranged in a form of matrix, each of the plurality of display elements being the same as the display element according to claim 15;
a plurality of wired lines configured to individually apply gate voltage to the field-effect transistors in the plurality of display elements; and
a display control device configured to individually control the gate voltage of the field effect transistors via the plurality of wired lines correspondingly to the image data.

18. A system comprising:
the image display device according to claim 17; and
circuitry configured to generate image data based on image information to be displayed and to output the image data to the image display device.

* * * * *